(12) United States Patent
Huang et al.

(10) Patent No.: US 11,587,886 B2
(45) Date of Patent: Feb. 21, 2023

(54) SEMICONDUCTOR DEVICE

(71) Applicant: TAIWAN SEMICONDUCTOR MANUFACTURING COMPANY LTD., Hsinchu (TW)

(72) Inventors: Kuan-Yu Huang, Taipei (TW); Sung-Hui Huang, Yilan County (TW); Pai-Yuan Li, Taichung (TW); Shu-Chia Hsu, Hsinchu (TW); Hsiang-Fan Lee, Hsinchu (TW); Szu-Po Huang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

(21) Appl. No.: 16/854,666

(22) Filed: Apr. 21, 2020

(65) Prior Publication Data
US 2020/0251427 A1   Aug. 6, 2020

Related U.S. Application Data

(63) Continuation of application No. 15/713,114, filed on Sep. 22, 2017, now Pat. No. 10,629,545.

(Continued)

(51) Int. Cl.
*H01L 23/00*     (2006.01)
*H01L 23/04*     (2006.01)

(52) U.S. Cl.
CPC .......... *H01L 23/562* (2013.01); *H01L 23/04* (2013.01); *H01L 2224/73204* (2013.01);

(Continued)

(58) Field of Classification Search
None
See application file for complete search history.

(56) References Cited

U.S. PATENT DOCUMENTS 6,389,687 B1    5/2002  Glenn et al.
6,703,704 B1 *  3/2004  Alcoe .................... H01L 23/10
                                                257/E23.101

(Continued)

FOREIGN PATENT DOCUMENTS

CN    102479724 A    5/2012
TW    201539679 A   10/2015

OTHER PUBLICATIONS

Office Action and Search Report dated Sep. 15, 2020 issued by Taiwan Intellectual Property Office for counterpart application No. 106139373.

(Continued)

*Primary Examiner* — Sarah K Salerno
(74) *Attorney, Agent, or Firm* — WPAT Law; Anthony King

(57) ABSTRACT

A semiconductor device includes a substrate, an electronic component, a ring structure and an adhesive layer. The substrate has a first surface. The electronic component is over the first surface of the substrate. The ring structure is over the first surface of the substrate, wherein the ring structure includes a first part having a first height, and a second part recessed from the bottom surface and having a second height lower than the first height. The adhesive layer is interposed between the first part of the ring structure and the substrate, and between the second part of the ring structure and the substrate.

20 Claims, 26 Drawing Sheets

Related U.S. Application Data

(60) Provisional application No. 62/469,243, filed on Mar. 9, 2017.

(52) U.S. Cl.
CPC ............... *H01L 2224/73253* (2013.01); *H01L 2924/15311* (2013.01); *H01L 2924/3511* (2013.01)

(56) References Cited

U.S. PATENT DOCUMENTS

| | | |
|---|---|---|
| 8,952,526 B2 | 2/2015 | Lin et al. |
| 8,986,806 B1 * | 3/2015 | Baloglu ............... H05K 1/0271 |
| | | 428/81 |
| 2005/0168952 A1 | 8/2005 | Chen et al. |
| 2007/0114620 A1 * | 5/2007 | Fujii ....................... B81B 7/007 |
| | | 257/E23.181 |
| 2011/0127655 A1 | 6/2011 | Fujii |
| 2015/0206817 A1 | 7/2015 | Yang et al. |
| 2017/0092619 A1 * | 3/2017 | Refai-Ahmed ..... H01L 21/4882 |
| 2018/0233459 A1 * | 8/2018 | Fushimi .................. H01L 23/34 |
| 2018/0263146 A1 | 9/2018 | Lin et al. |

OTHER PUBLICATIONS

Office Action dated Jun. 28, 2021 issued by the China National Intellectual Property Administration for the Chinese Counterpart Application No. 201711095986.5.
Office Action of China patent application No. 201711095986.5, dated Nov. 25, 2020.
US20180263146A1 Corresponds to TW201539679A.
US8952526B2 Corresponds to CN102479724A.

* cited by examiner

SEMICONDUCTOR DEVICE

CROSS REFERENCE TO RELATED APPLICATIONS

This application is a continuation of U.S. application Ser. No. 15/713,114 filed on Sep. 22, 2017, now allowed, which claims the benefit of U.S. provisional application No. 62/469,243 filed on 9 Mar. 2017. All of the above-referenced applications are hereby incorporated herein by reference in their entirety.

BACKGROUND

Semiconductor devices are subject to a wide range of temperature variations. Due to differences in the thermal coefficient of expansion (CTE) of various structural layers, the semiconductor devices suffer from warpage issue. To control this warpage, ring structures e.g., stiffeners are incorporated into the semiconductor devices. The stiffener rings provide extra support to the semiconductor devices thus reducing warpage. However, the stiffener rings tend to delaminate due to temperature variations during thermal cycle, and thus inversely affects reliability of the semiconductor devices.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
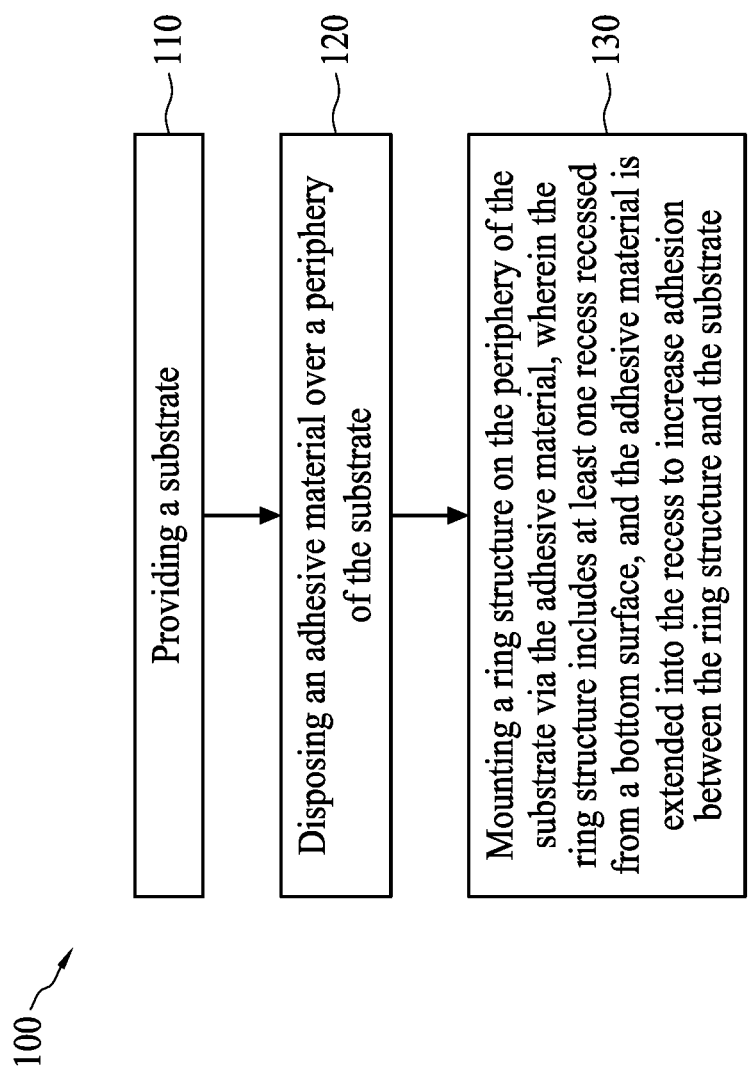
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure, Additionally, the structures and methods disclosed herein may be used in conjunction with testing methodologies that incorporate intermediate verification of known good dies to increase the yield and decrease costs.

In one or more embodiments of the present disclosure, the semiconductor device includes an adhesive layer having a thicker portion between a ring structure and a substrate and configured as a stress buffer. The thicker portion also aids to increase the contact area between the ring structure and the substrate, and thus increases adhesion. In some embodiments, the adhesive layer is extended to an inner edge and/or an outer edge of the ring structure to further increase the contact area between the ring structure and the adhesive layer, and thus adhesion is further enhanced. In some embodiments, the ring structure may be further configured as a lid structure or a shielding element enclosing an electronic component.

FIG. 1 is a flow chart illustrating a method for manufacturing a semiconductor device according to various aspects of one or more embodiments of the present disclosure. The method 100 begins with operation 110 in which a substrate is provided. The method 100 proceeds with operation 120 in which an adhesive material is disposed over a periphery of the substrate. The method 100 continues with operation 130 in which a ring structure is mounted on the periphery of the substrate via the adhesive material. The ring structure includes a first part, and a second part recessed from a bottom surface, and the adhesive material includes a first portion interposed between the first part of the ring structure and the substrate, and a second portion between the second part of the ring structure and the substrate.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
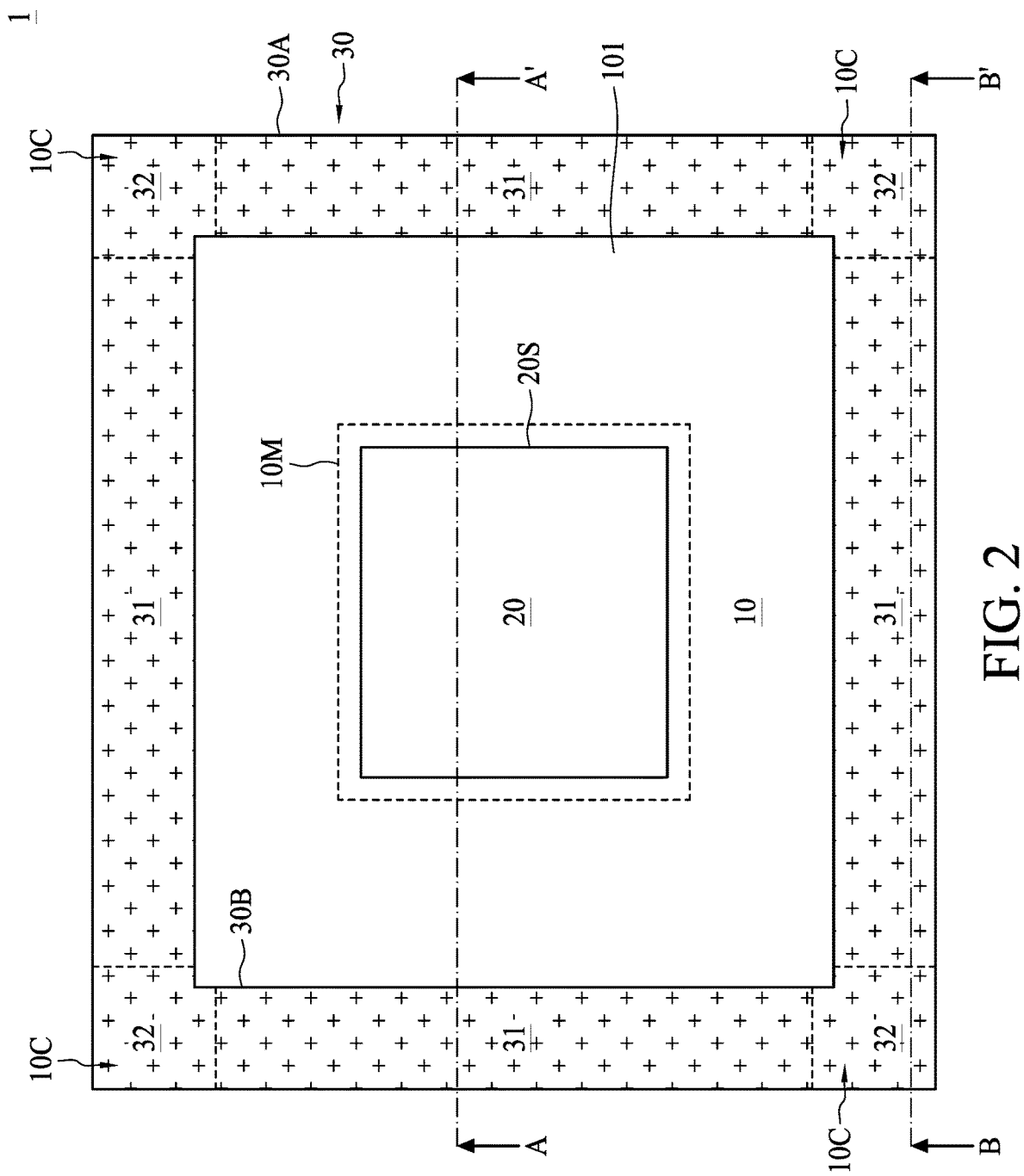
FIG. 2 is a schematic top view of a semiconductor device according to one or more embodiments of the present disclosure.
Figure 2A:
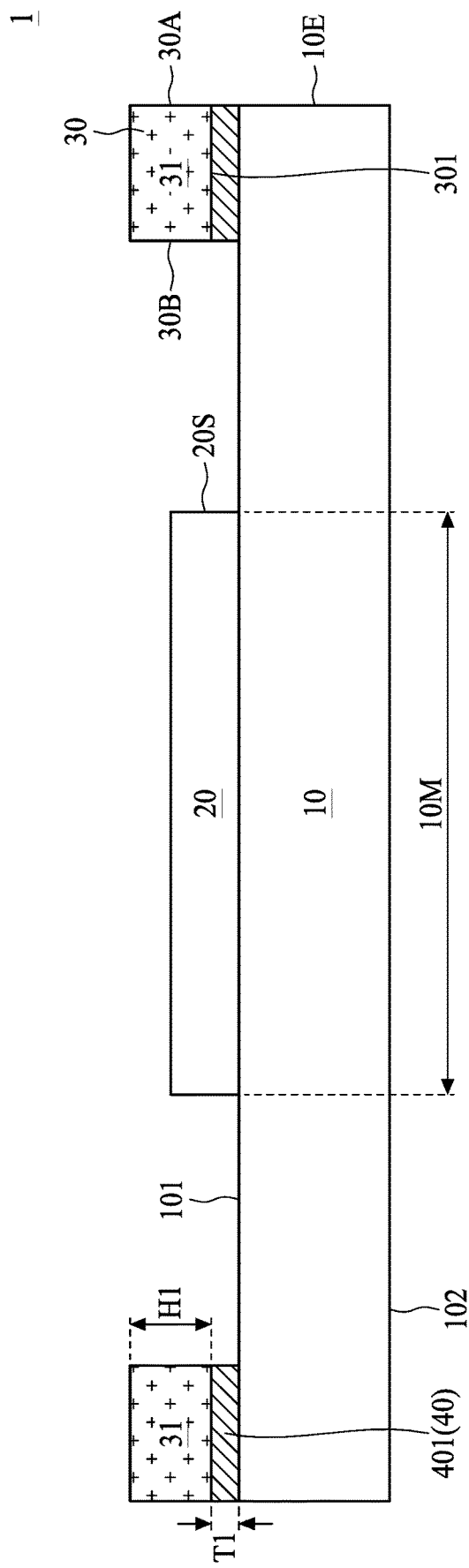
FIG. 2A is a schematic cross-sectional view of a semiconductor device taken along a line A-A' of FIG. 2.
Figure 2B:
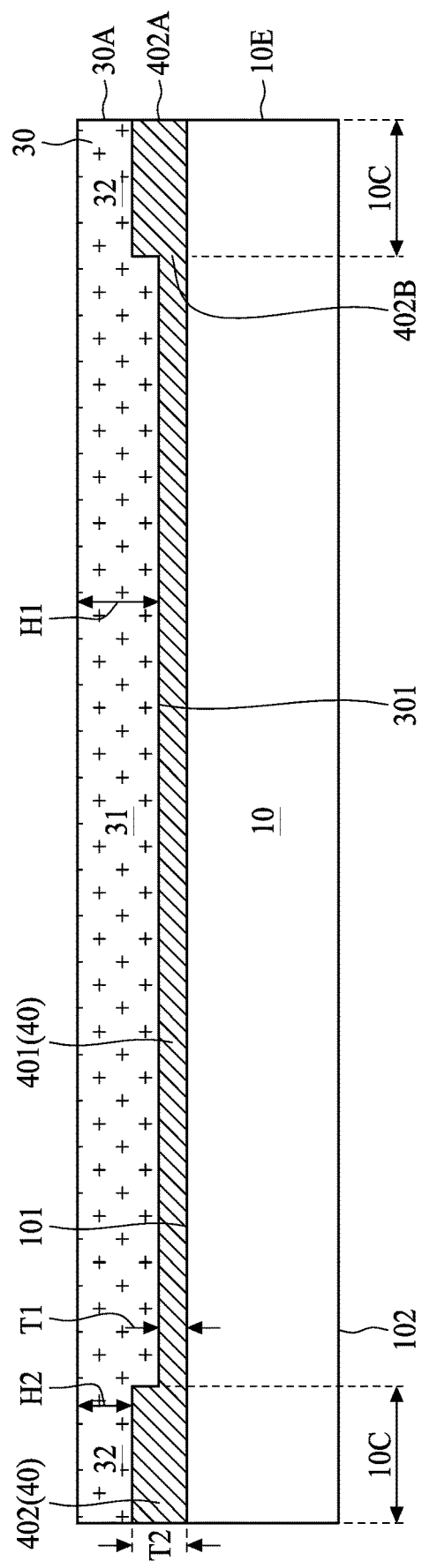
FIG. 2B is a schematic cross-sectional view of a semiconductor device taken along a line B-B' of FIG. 2.

FIG. 2 is a schematic top view of a semiconductor device according to one or more embodiments of the present disclosure, FIG. 2A is a schematic cross-sectional view of a semiconductor device taken along a line A-A', and FIG. 2B is a schematic cross-sectional view of a semiconductor device taken along a line B-B'. As depicted in FIG. 2, FIG. 2A and FIG. 2B, the semiconductor device 1 includes a substrate 10, an electronic component 20, a ring structure 30 and an adhesive layer 40. The substrate 10 includes a first surface 101. In some embodiments, the substrate 10 includes a semiconductor substrate, By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof. In some embodiments, the substrate 10 may include silicon-on-insulator (SOI) substrate, a germanium-on-insulator (GOI) substrate, or the like. In some embodiments, the substrate 10 may include an interposer substrate, a package substrate, or the like.

The electronic component 20 is disposed over the first surface 101 of the substrate 10. In some embodiments, the electronic component 20 is mounted on a die mounting region 10M of the substrate 10, and the electronic component 20 may be electrically connected to a circuit layer (not shown) such as a redistribution layer (RDL), through substrate vias (TSVs), conductive posts, conductive pillars, a combination thereof, or the like. In some embodiments, the electronic component 20 includes an integrated circuit die such as a semiconductor die, an electronic die, a MEMS die, a combination thereof, or the like. In some embodiments, the electronic component 20 may include a package such as a 2.5D or a 3D package.

The ring structure 30 is disposed over the first surface 101 of the substrate 10 and adjacent to edges 20S of the electronic component 20. In some embodiments, the ring structure 30 is configured as a stiffener ring, and helps to alleviate warpage of the substrate 10 and/or to enhance robustness of the substrate 10. In some embodiments, an outer edge 30A of the ring structure 30 is substantially aligned with an edge 10E of the substrate 10, The ring structure 30 includes a bottom surface 301 facing the first surface 101 of the substrate 10. In some embodiments, the material of the ring structure 30 may include metal such as copper, stainless steel, stainless steel/Ni, brass, aluminum or the like, but is not limited thereto. In some embodiments, the ring structure 30 includes a first part 31 having a first height H1, and a second part 32 recessed from the bottom surface 301 and having a second height H2 lower than the first height H1. In some embodiments, the second part 32 of the ring structure 30 includes segmented parts substantially corresponding to corners 10C, of the substrate 10, respectively.

The adhesive layer 40 is interposed between the first surface 101 of the substrate 10 and the bottom surface 301 of the ring structure 30. In some embodiments, the adhesive layer 40 is interposed between the first part 31 of the ring structure 30 and the substrate 10, and between the second part 32 of the ring structure 30 and the substrate 10. The adhesive layer 40 is configured to bond the ring structure 30 to the substrate 10. In some embodiments, the material of the adhesive layer 40 may be more flexible and softer than that of the substrate 10 and the ring structure 30. Examples of the material for the adhesive layer 40 may include organic adhesive material such as epoxy, polyimide (PI), polybenzoxazole (PBO), benzo-cyclo-butene (BCB), but are not limited thereto. In some embodiments, the adhesive layer 40 includes a first portion 401 substantially aligned with the first part 31 of the ring structure 30, and a second portion 402 substantially aligned with the second part 32 of the ring structure. In some embodiments, the first portion 401 has a first thickness T1, the second portion 402 has a second thickness T2, and the second thickness T2 is larger than the first thickness T1. In some embodiments, the second portion 402 of the adhesive layer 40 includes segmented portions substantially corresponding to corners 10C of the substrate, respectively. In some embodiments, the segmented portions of the second portion 402 are protruded toward the second part 32 of the ring structure 30, and thus have the second thickness T2 larger than the first thickness T1 of the first portion 401. In some embodiments, the second portion 402 of the adhesive layer 40 may include a polyhedron shape, or any other suitable shape. In some embodiments, the second portion 402 of the adhesive layer 40 may include an octahedron shape, but not limited thereto. In some embodiments, the second portion 402 of the adhesive layer 40 may include an L-shaped cross-section. In some embodiments, at least an outer edge 402A or an inner edge 402B of the second portion 402 of the adhesive layer 40 is exposed from the ring structure 30. In some embodiments, the adhesive layer 40 may be extended to be disposed on at least a portion of the inner edge 30B of the ring structure 30 to increase adhesion. In some embodiments, the adhesive layer 40 may be extended to be disposed on at least a portion of the outer edge 30A of the ring structure 30 to increase adhesion.

In some embodiments, the softer and flexible second portion 402 having the thicker thickness T2 is disposed in a stress concentrated region such as corner of the substrate 10. The second portion 402 of the adhesive layer 40 may be configured as a stress buffer that provides cushioning effect between the substrate 10 and the ring structure 30. In some embodiments, the recessed second portion 402 enlarges the contact area between the ring structure 30 and the adhesive layer 40, and thus increases adhesion. In some embodiments, the second portion 402 can reduce stress concentration at the corner, alleviate delamination of the ring structure 30, reduce risk of substrate crack, and enhance reliability and durability of ring structure 30.

The semiconductor device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
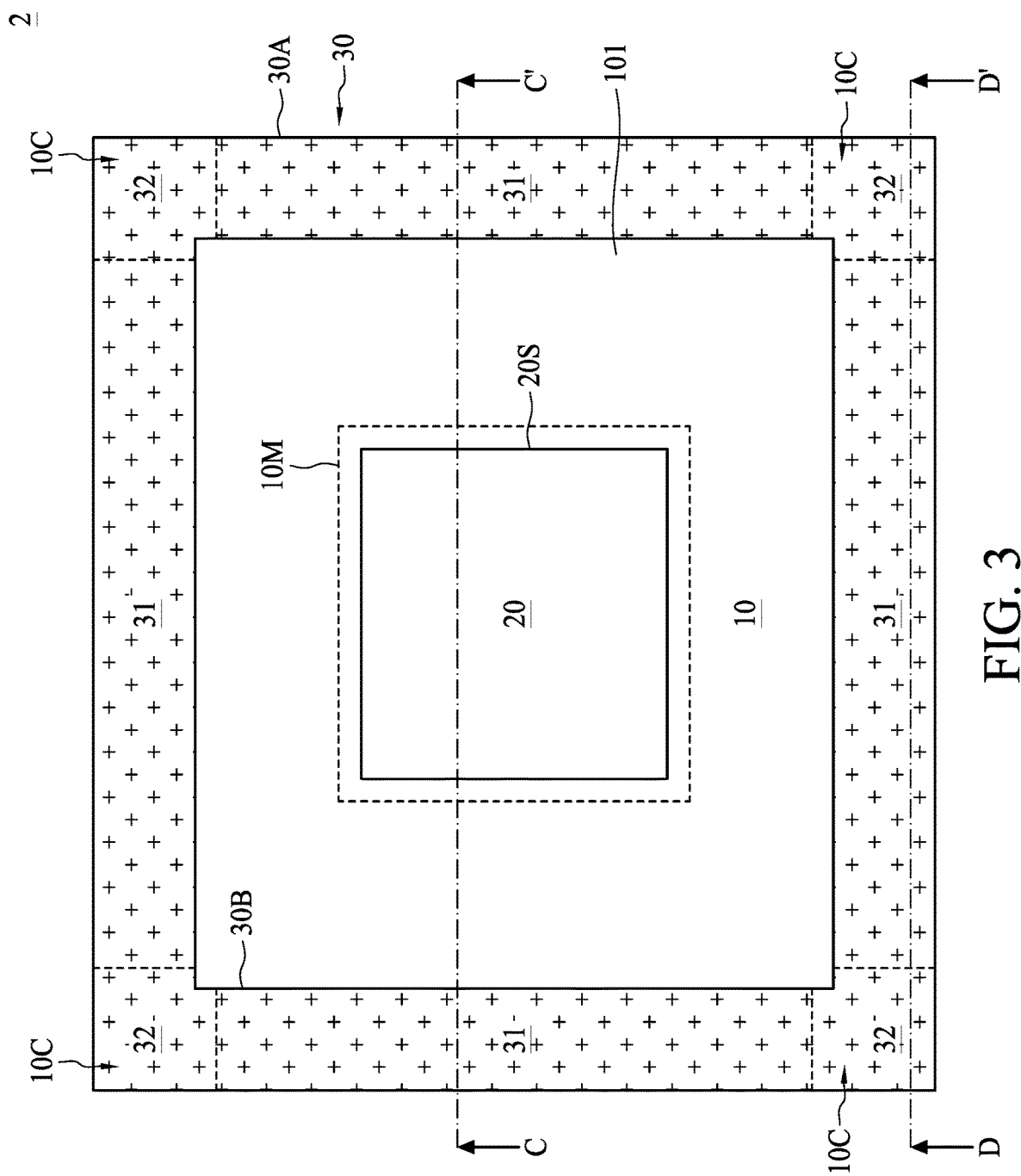
FIG. 3 is a schematic top view of a semiconductor device according to one or more embodiments of the present disclosure.
Figure 3A:
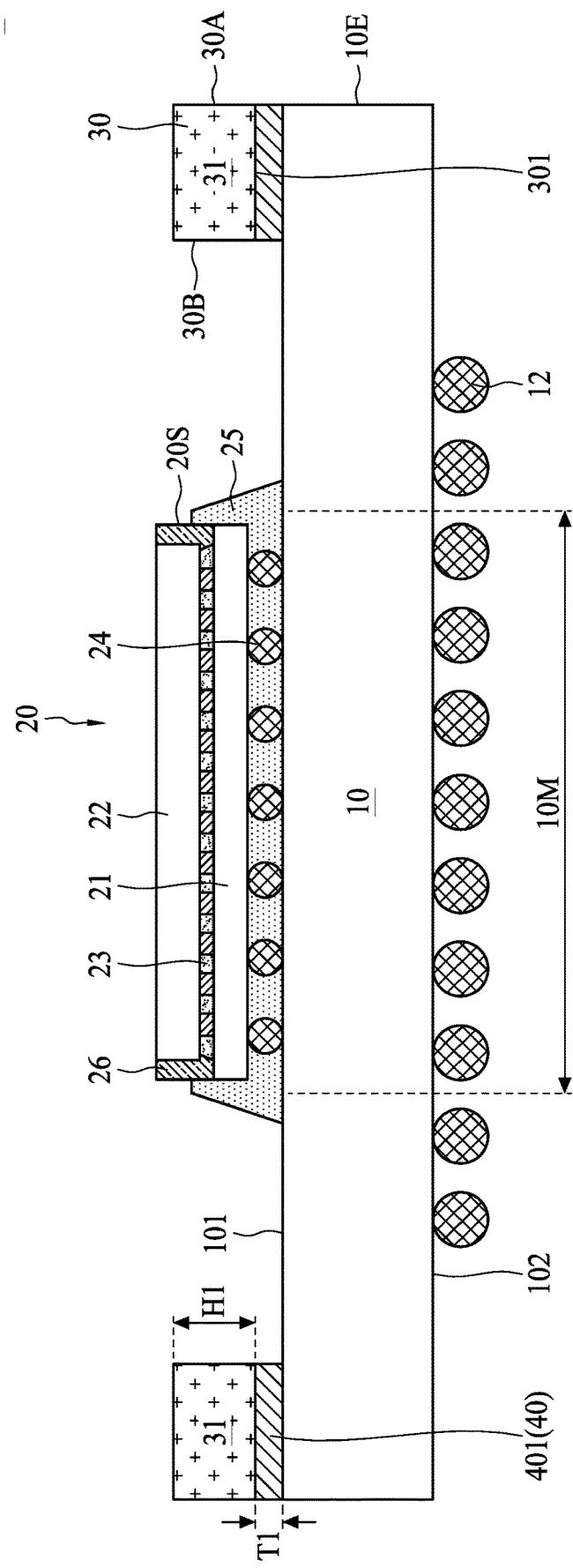
FIG. 3A is a schematic cross-sectional view of a semiconductor device taken along a line C-C' of FIG. 3.
Figure 3B:
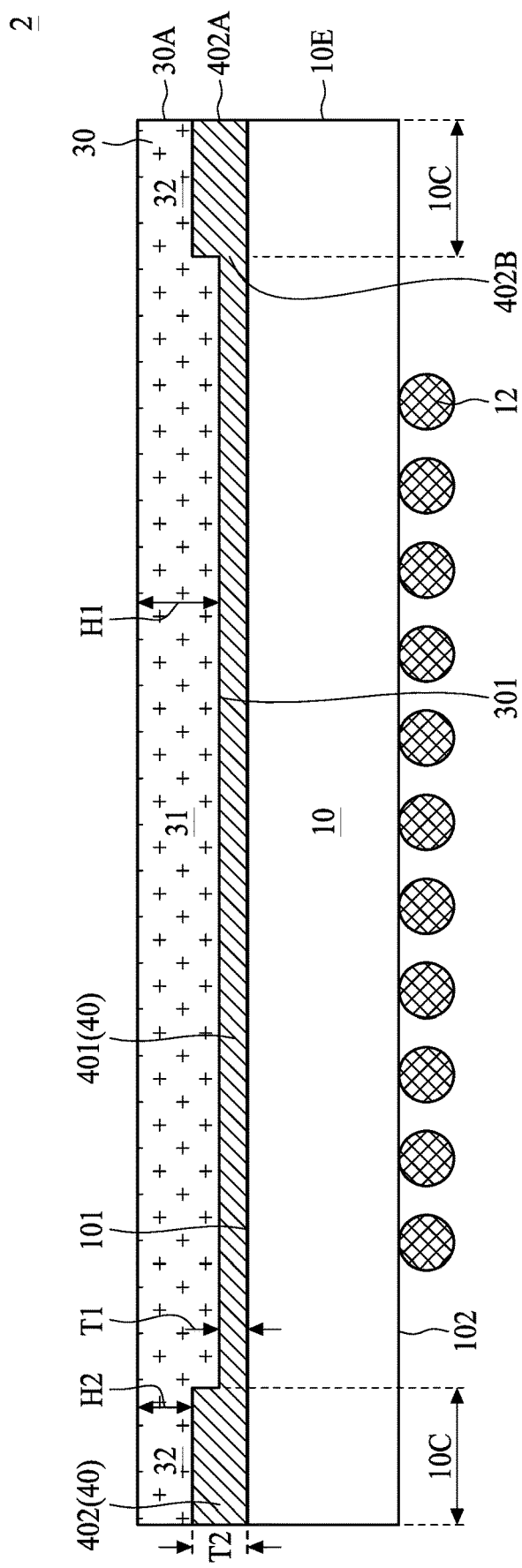
FIG. 3B is a schematic cross-sectional view of a semiconductor device taken along a line D-D' of FIG. 3.

FIG. 3 is a schematic top view of a semiconductor device according to one or more embodiments of the present disclosure, FIG. 3A is a schematic cross-sectional view of a semiconductor device taken along a line C-C', and FIG. 3B is a schematic cross-sectional view of a semiconductor device taken along a line D-D'. As depicted in FIG. 3, FIG. 3A and FIG. 3B, the semiconductor device 2 may include package such as a 2.5D or a 3D IC package. In some embodiments, the semiconductor device 2 may include a chip on wafer on substrate (CoWoS) package structure, and the electronic component 20 may include a chip on wafer (CoW) die. In some embodiments, the electronic component 20 includes an interposer 21, a semiconductor die 22, interconnects 23, first connectors 24, an underfill 25 and an encapsulant 26. In some embodiments, the interposer 21 may include through vias such as through substrate vias (TSVs) or the like electrically connected to the interconnects 23 disposed over the front surface of the interposer 21 and the first connectors 24 disposed over the bottom surface of the interposer 21. In some embodiments, the semiconductor die 22 is disposed over the interposer 21, and electrically connected to the interposer 21 through the interconnects 23. In some embodiments, the interconnects 23 may include, but are not limited to be, conductive bumps, conductive pastes, conductive balls or the like. In some embodiments, the first connectors 24 are disposed between and electrically connected to the substrate 10 and the interposer 21. In some embodiments, the first connectors 24 may include, but are not limited to be, conductive bumps, conductive pastes, conductive balls or the like. In some embodiments, the underfill 25 is disposed between the substrate 10 and the interposer 21 and encloses the first connectors 24. In some embodiments, the encapsulant 26 encapsulates at least a portion of the interposer 21 and the semiconductor die 22.

In some embodiments, the substrate 10 may include a circuit layer (not shown) such as a redistribution layer (RDL), through substrate vias (TSVs), conductive posts, conductive pillars, a combination thereof, or the like. In some embodiments, the semiconductor device 2 may further include second connectors 12 over a second surface 102 of the substrate 10. In some embodiments, the second connectors 12 may be electrically connected to the first connectors 24 through the circuit layer of the substrate 10. In some embodiments, the second connectors 12 are configured to be electrically connected to a circuit board such as a PCB. In some embodiments, the second connectors 12 may include, but are not limited to be, conductive bumps, conductive pastes, conductive balls or the like.

In some embodiments, the second portion 402 having the thicker thickness T2 is disposed in a stress concentrated region such as corner of the substrate 10. The second portion 402 of the adhesive layer 40 may be configured as a stress buffer that provides cushioning effect between the substrate 10 and the ring structure 30. In some embodiments, the recessed second portion 402 enlarges the contact area between the ring structure 30 and the adhesive layer 40, and thus increases adhesion. In some embodiments, the second portion 402 can reduce stress concentration at the corner, alleviate delamination of the ring structure 30, reduce risk of substrate crack, and enhance reliability and durability of ring structure 30.

Figure 4:
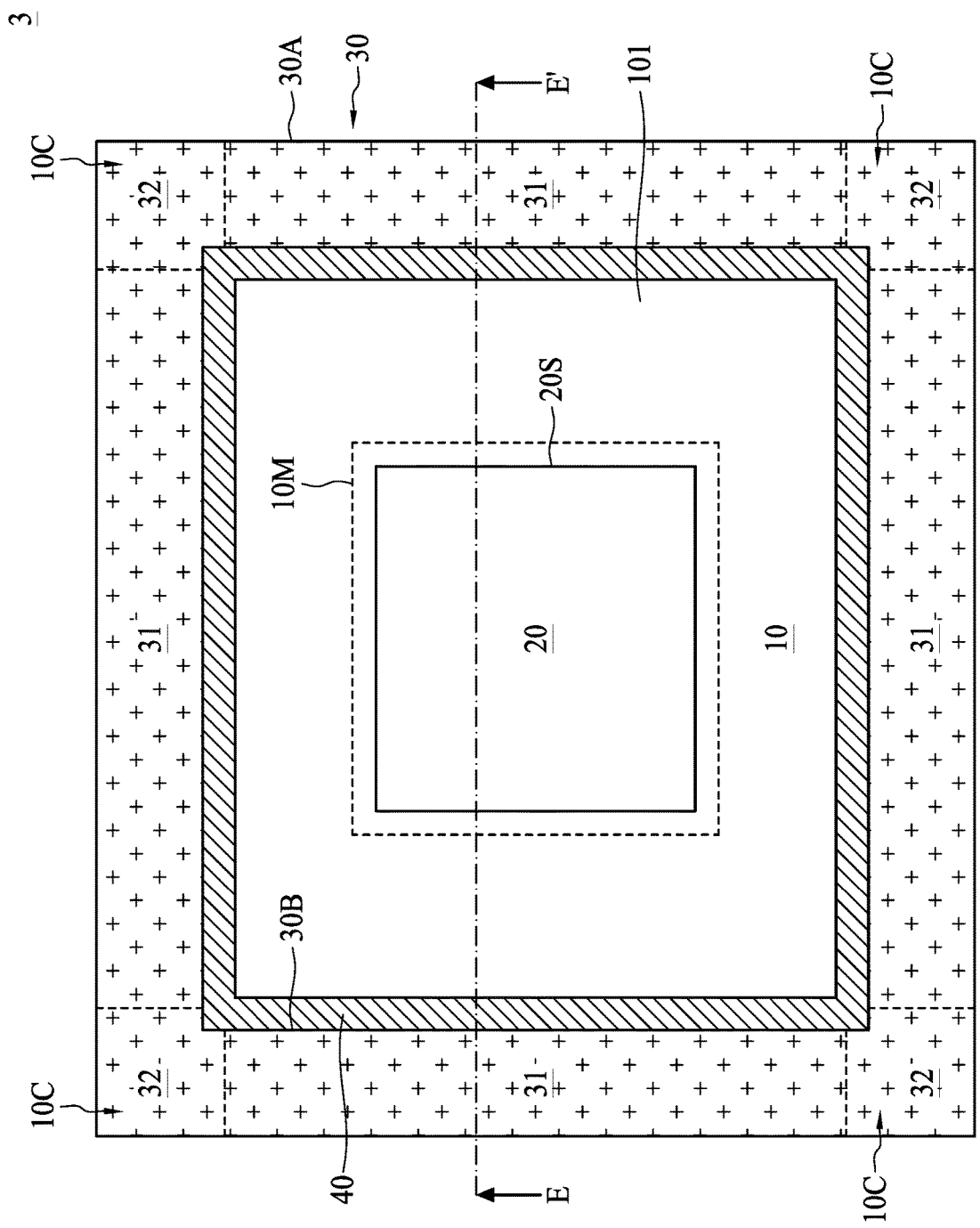
FIG. 4 is a schematic top view of a semiconductor device according to one or more embodiments of the present disclosure.
Figure 4A:
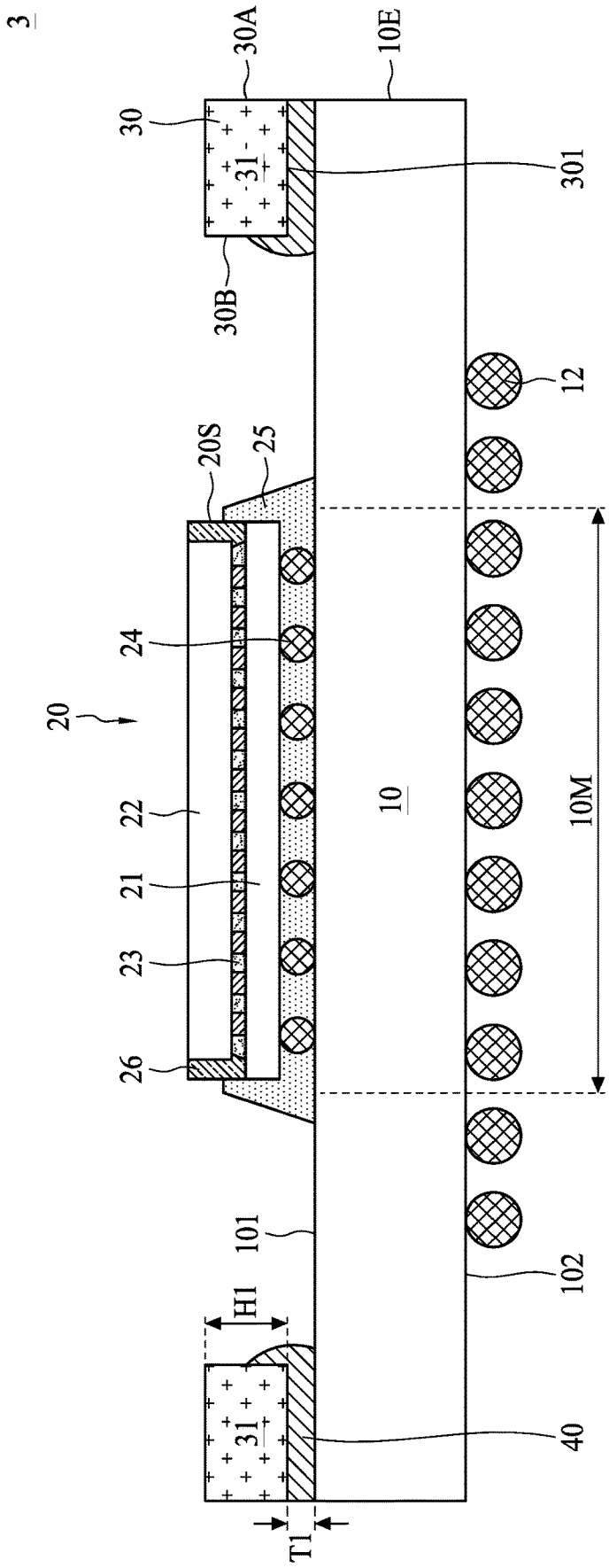
FIG. 4A is a schematic cross-sectional view of a semiconductor device taken along a line E-E' of FIG. 4.

FIG. 4 is a schematic top view of a semiconductor device according to one or more embodiments of the present disclosure, and FIG. 4A is a schematic cross-sectional view of a semiconductor device taken along a line E-E'. As depicted in FIG. 4 and FIG. 4A, the adhesive layer 40 is further extended to be disposed on at least a portion of the inner edge 30B of the ring structure 30 to increase adhesion of the adhesive layer 40 to the inner edge 30B of the ring structure 30. Consequently, the reliability of the ring structure 30 can be further enhanced.

Figure 5:
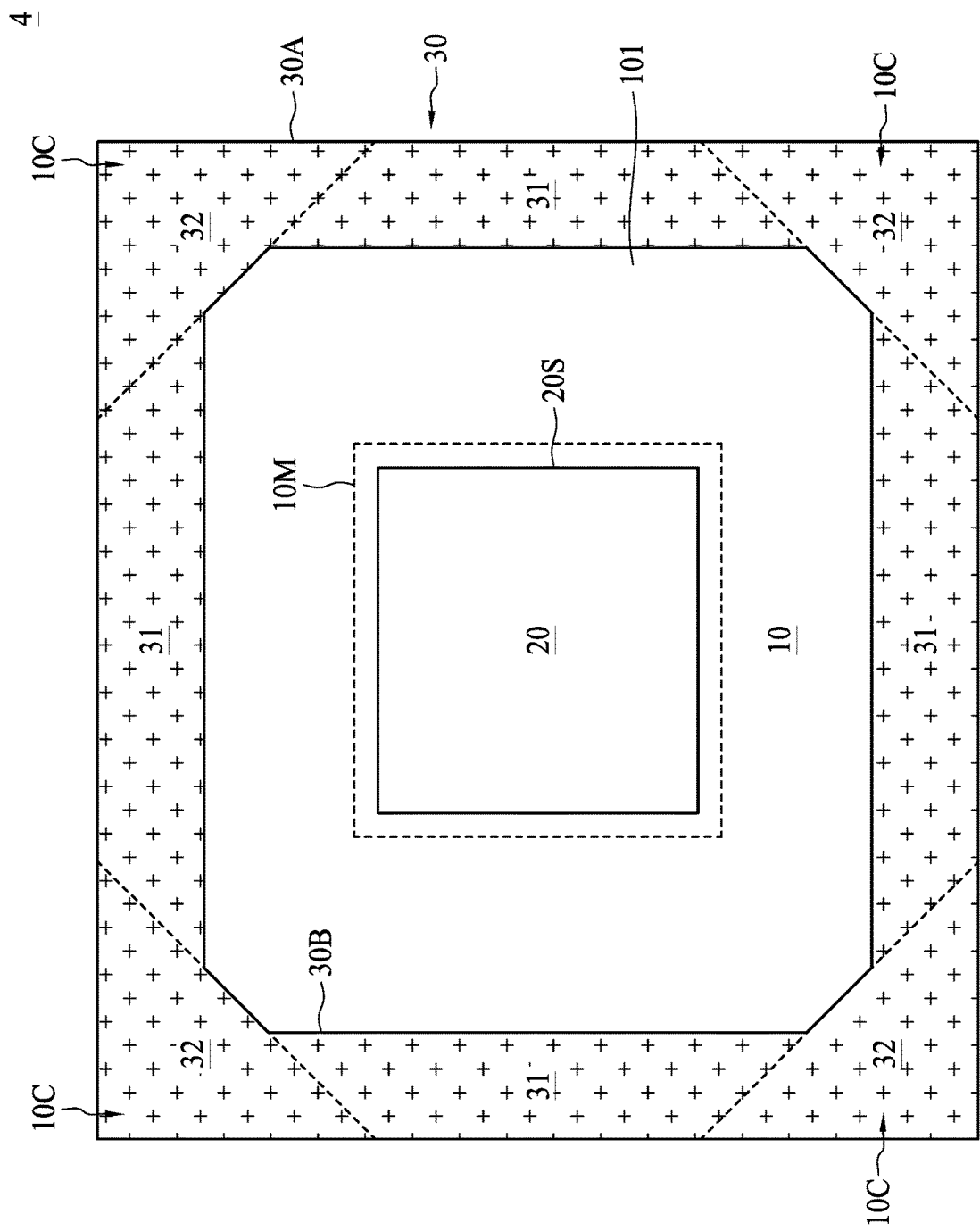
FIG. 5 is a schematic top view of a semiconductor device according to one or more embodiments of the present disclosure.

FIG. 5 is a schematic top view of a semiconductor device according to one or more embodiments of the present disclosure. As depicted in FIG. 5, the second portion 402 of the adhesive layer 40 of the semiconductor device 4 may include a hexahedron shape such as a cuboid, but not limited thereto. In some embodiments, second portion 402 of the adhesive layer 40 may include a triangular shape cross-section.

Figure 6:
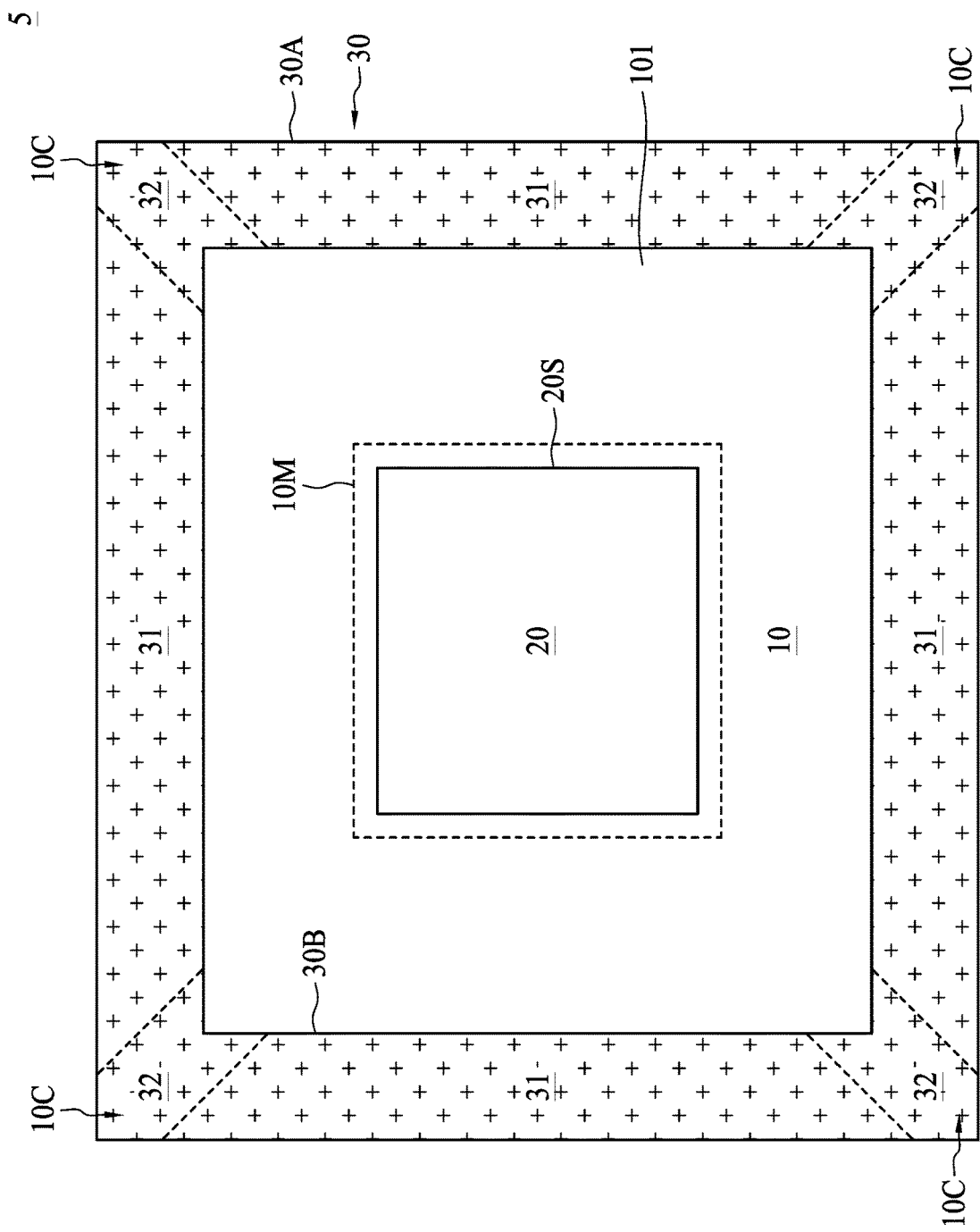
FIG. 6 is a schematic top view of a semiconductor device according to one or more embodiments of the present disclosure.

FIG. 6 is a schematic top view of a semiconductor device according to one or more embodiments of the present disclosure. As depicted in FIG. 6, the second portion 402 of the adhesive layer 40 of the semiconductor device 5 may include an octahedron shape, but not limited thereto. In some embodiments, the second portion 402 of the adhesive layer 40 may include an arrow shape cross-section.

Figure 7:
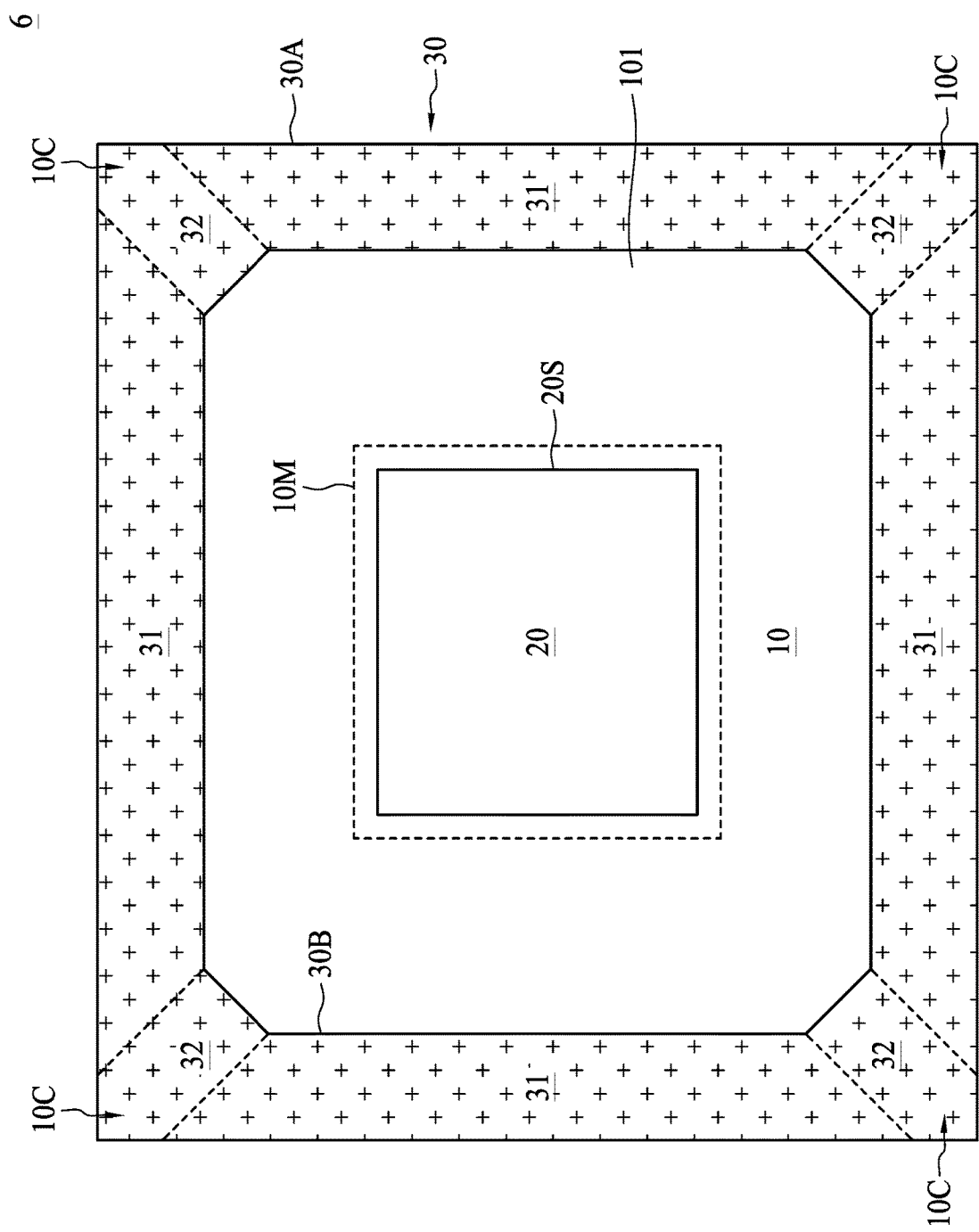
FIG. 7 is a schematic top view of a semiconductor device according to one or more embodiments of the present disclosure.

FIG. 7 is a schematic top view of a semiconductor device according to one or more embodiments of the present disclosure. As depicted in FIG. 7, the second portion 402 of the adhesive layer 40 of the semiconductor device 6 may include a heptahedron shape, but not limited thereto. In some embodiments, the second portion 402 of the adhesive layer 40 may include an arrow shape cross-section.

Figure 8:
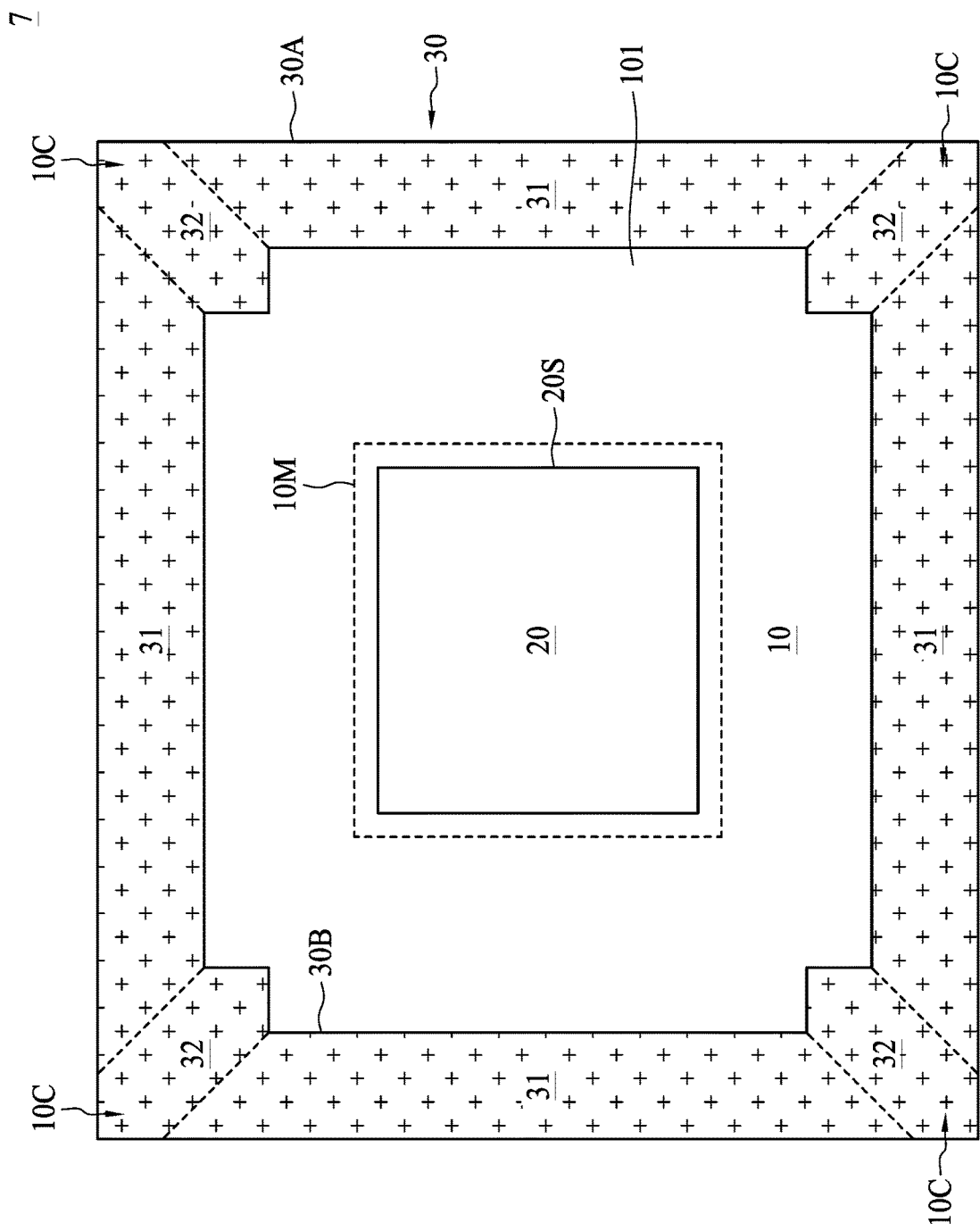
FIG. 8 is a schematic top view of a semiconductor device according to one or more embodiments of the present disclosure.
Figure 9:
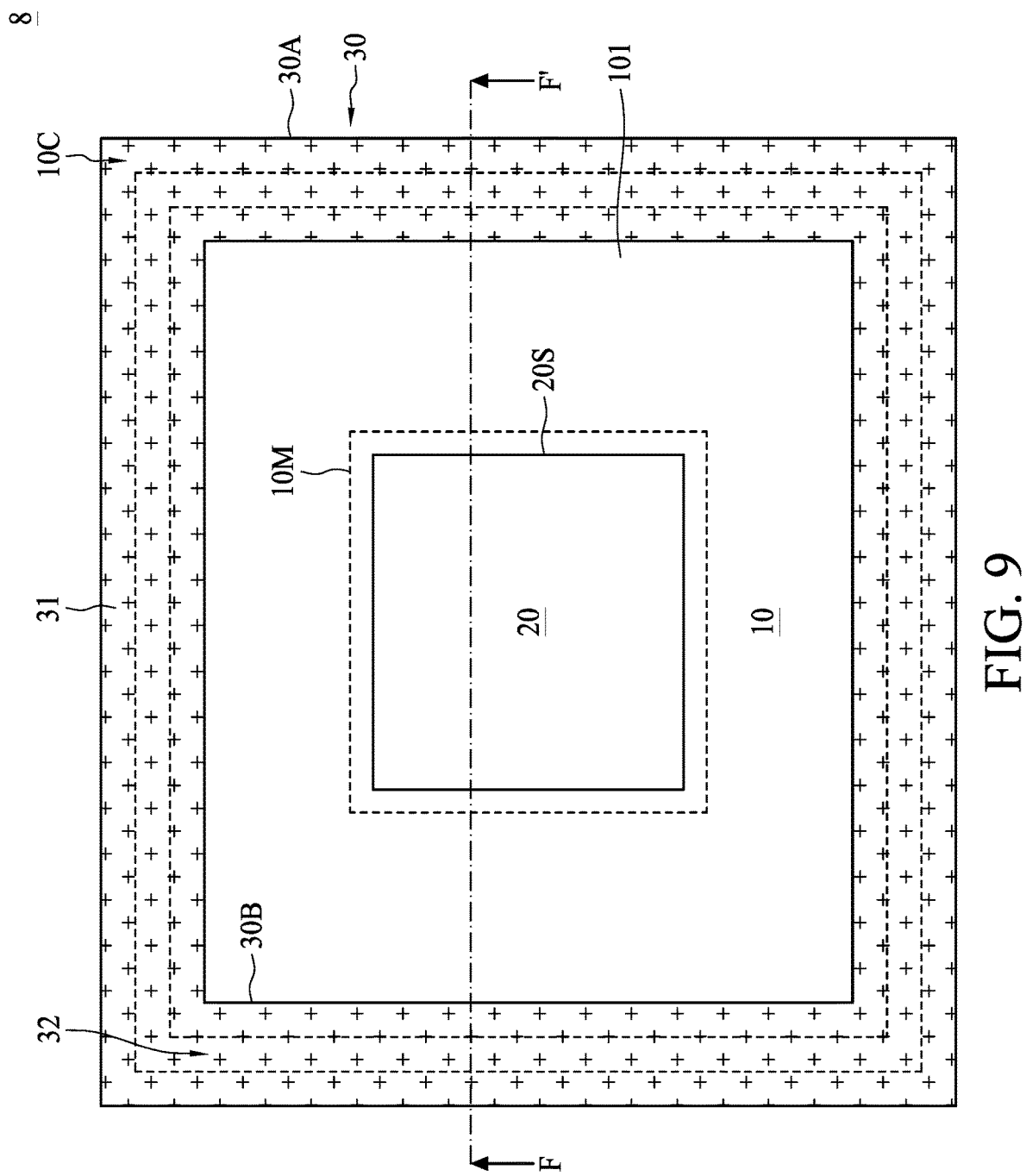
FIG. 9 is a schematic top view of a semiconductor device according to one or more embodiments of the present disclosure.
Figure 9A:
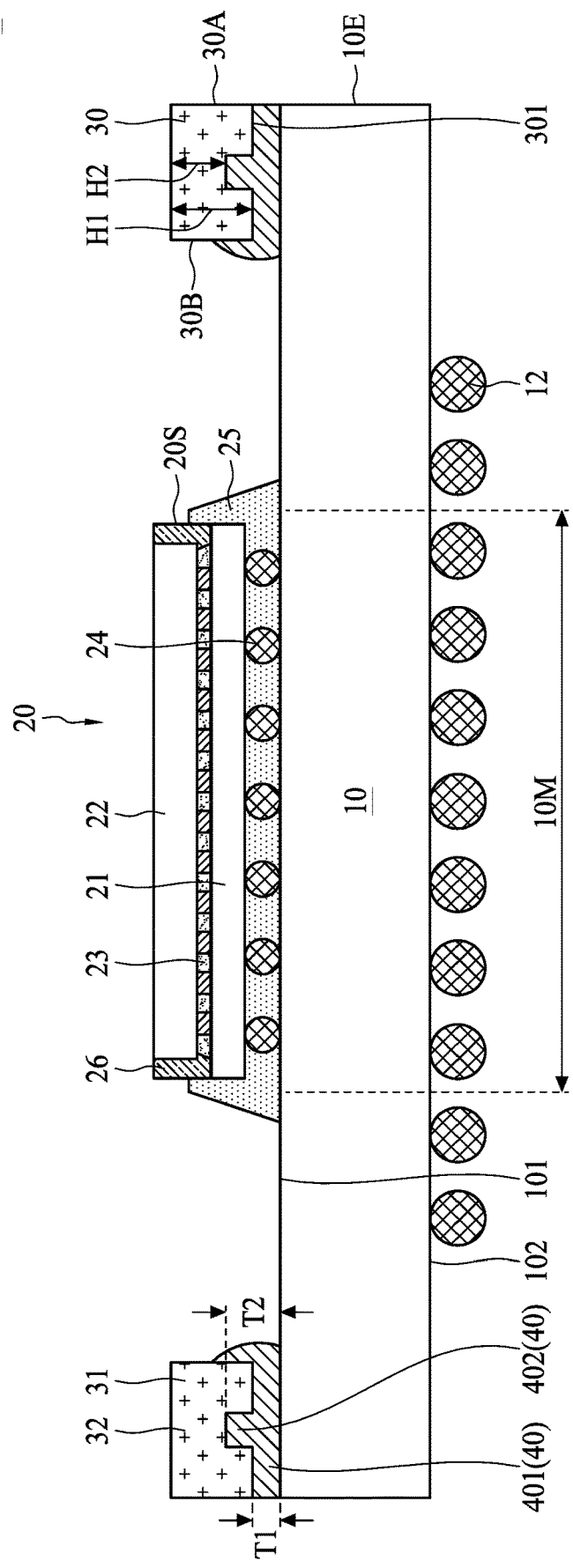
FIG. 9A is a schematic cross-sectional view of a semiconductor device taken along a line F-F' of FIG. 9.

FIG. 8 is a schematic top view of a semiconductor device according to one or more embodiments of the present disclosure. As depicted in FIG. 8, the second portion 402 of the adhesive layer 40 of the semiconductor device 7 may include an octahedron shape, but not limited thereto. In some embodiments, the second portion 402 of the adhesive layer 40 may include a double-headed arrow shape cross-section, FIG. 9 is a schematic top view of a semiconductor device according to one or more embodiments of the present disclosure, and FIG. 9A is a schematic cross-sectional view of a semiconductor device taken along a line F-F'. As depicted in FIG. 9 and FIG. 9A, the second part 32 of the ring structure 30 of the semiconductor device 8 may be substantially corresponding to a periphery of the substrate 10. In some embodiments, the adhesive layer 40 includes a first portion 401 and a second portion 402. In some embodiments, the second portion 402 of the adhesive layer 40 is extended toward second part 32 of the ring structure 30, and thus has a second thickness T2 larger than a first thickness T1 of the first portion 401. In some embodiments, an inner edge and an outer edge of the second portion 402 of the adhesive layer 40 are enclosed by the ring structure 30. In some embodiments, the second portion 402 of the adhesive layer 40 includes a continuous portion. The engaged second portion 402 increases the contact area between the ring structure 30 and the adhesive layer 40, and thus the adhesion between the ring structure 30 and the adhesive layer 40 is increased. In some embodiments, the second part 32 of the ring structure 30 may be a continuous part surrounding the periphery of the substrate 10. In some embodiments, the second part 32 of the ring structure 30 may include several segmented parts. In some embodiments, the adhesive layer 40 is extended to be disposed on at least a portion of the inner edge 30B of the ring structure 30 to increase adhesion of the adhesive layer 40 to the inner edge 30B of the ring structure 30. Consequently, the reliability of the ring structure 30 can be further enhanced. In some embodiments, the outer edge 30A of the ring structure 30 may be recessed from an edge of the substrate 10. In some embodiments, the adhesive layer 40 may be extended to be disposed on at least a portion of the outer edge 30A of the ring structure 30 to increase adhesion of the adhesive layer 40 to the outer edge 30A of the ring structure 30. Consequently, the reliability of the ring structure 30 can be further enhanced.

Figure 10:
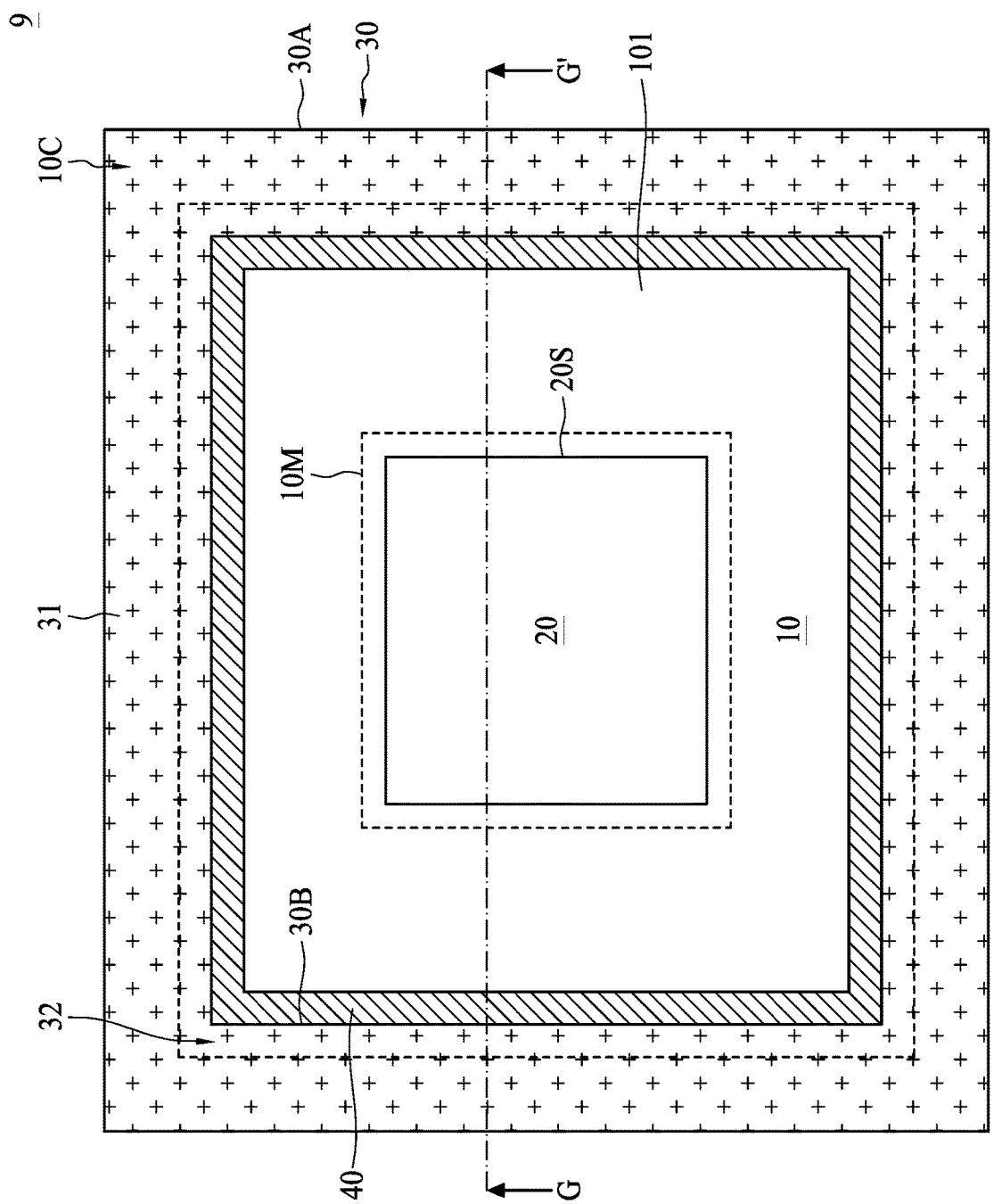
FIG. 10 is a schematic top view of a semiconductor device according to one or more embodiments of the present disclosure.
Figure 10A:
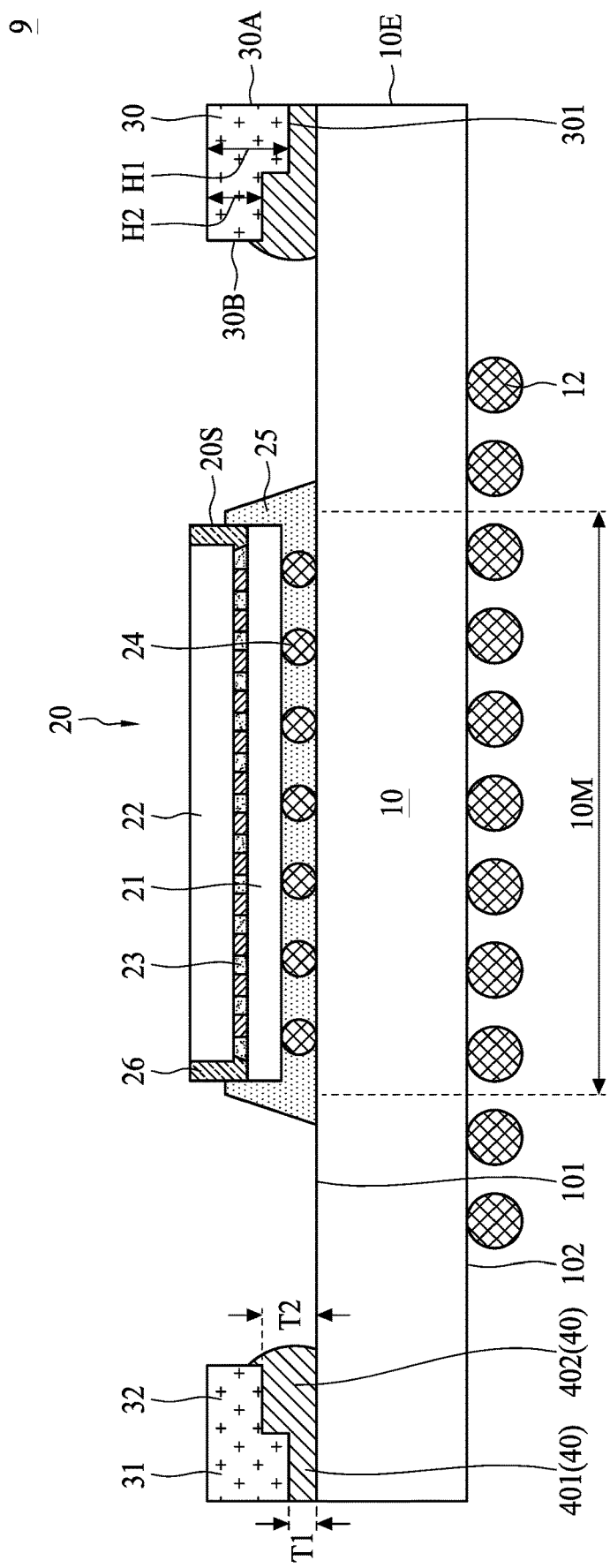
FIG. 10A is a schematic cross-sectional view of a semiconductor device taken along a line G-G' of FIG. 10.

FIG. 10 is a schematic top view of a semiconductor device according to one or more embodiments of the present disclosure, and FIG. 10A is a schematic cross-sectional view of a semiconductor device taken along a line G-G'. As depicted in FIG. 10 and FIG. 10A, in the semiconductor device 9 of some embodiments, an outer edge of the second portion 402 of the adhesive layer 40 is enclosed by the ring structure 30, while an inner edge of the second portion 402 of the adhesive layer 40 is exposed from the ring structure 30. The engaged second portion 402 increases the contact area between the ring structure 30 and the adhesive layer 40, and thus the adhesion between the ring structure 30 and the adhesive layer 40 is increased. In some embodiments, the adhesive layer 40 is further extended to be disposed on at least a portion of the inner edge 30B of the ring structure 30 to increase adhesion of the adhesive layer 40 to the inner edge 30B of the ring structure 30, Consequently, the reliability of the ring structure 30 can be further enhanced. In some embodiments, the outer edge 30A of the ring structure 30 may be recessed from an edge of the substrate 10. In some embodiments, the adhesive layer 40 may be extended to be disposed on at least a portion of the outer edge 30A of the ring structure 30 to increase adhesion of the adhesive layer 40 to the outer edge 30A of the ring structure 30. Consequently, the reliability of the ring structure 30 can be further enhanced.

Figure 11:
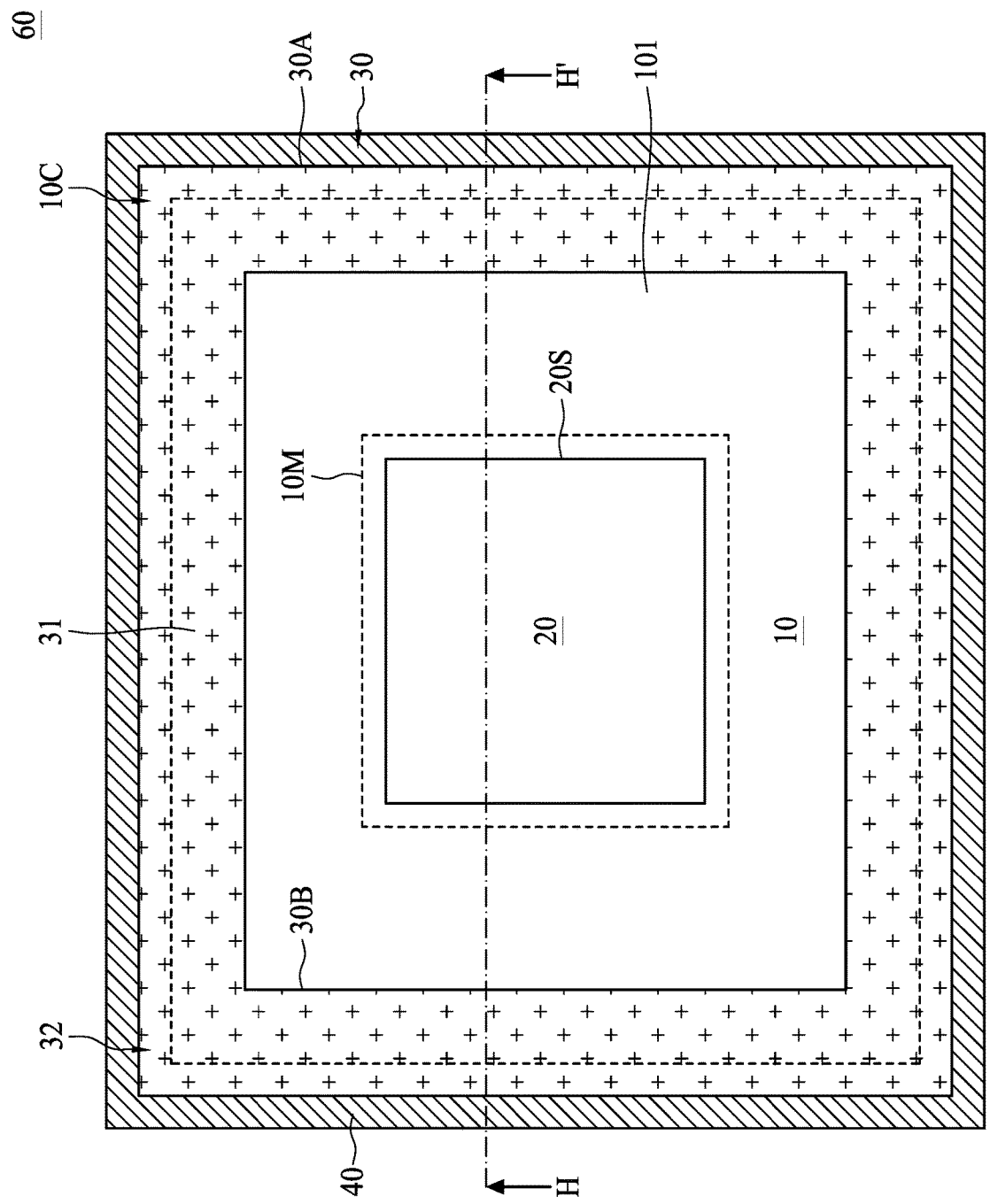
FIG. 11 is a schematic top view of a semiconductor device according to one or more embodiments of the present disclosure.
Figure 11A:
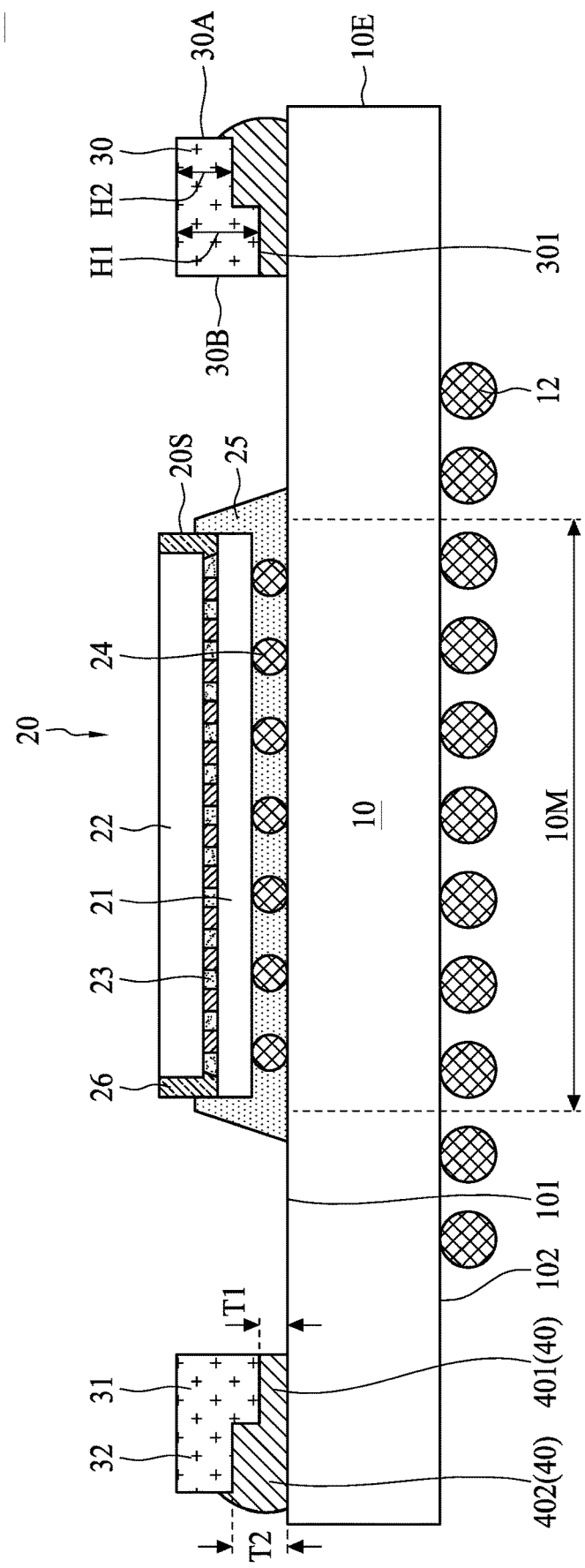
FIG. 11A is a schematic cross-sectional view of a semiconductor device taken along a line H-H' of FIG. 11.

FIG. 11 is a schematic top view of a semiconductor device according to one or more embodiments of the present disclosure, and FIG. 11A is a schematic cross-sectional view of a semiconductor device taken along a line H-H'. As depicted in FIG. 11 and FIG. 11A, in the semiconductor device 9 of some embodiments, an inner edge of the second portion 402 of the adhesive layer 40 is enclosed by the ring structure 30, while an outer edge of the second portion 402 of the adhesive layer 40 is exposed from the ring structure 30. The engaged second portion 402 increases the contact area between the ring structure 30 and the adhesive layer 40, and thus the adhesion between the ring structure 30 and the adhesive layer 40 is increased. In some embodiments, the adhesive layer 40 is further extended to be disposed on at least a portion of the outer edge 30A of the ring structure 30 to increase adhesion of the adhesive layer 40 to the inner edge 30B of the ring structure 30. Consequently, the reliability of the ring structure 30 can be further enhanced. In some embodiments, the outer edge 30A of the ring structure 30 may be recessed from an edge 10E of the substrate 10. In some embodiments, the adhesive layer 40 may be extended to be disposed on at least a portion of the inner edge 30B of the ring structure 30 to increase adhesion of the adhesive layer 40 to the inner edge 30B of the ring structure 30. Consequently, the reliability of the ring structure 30 can be further enhanced.

Figure 12:
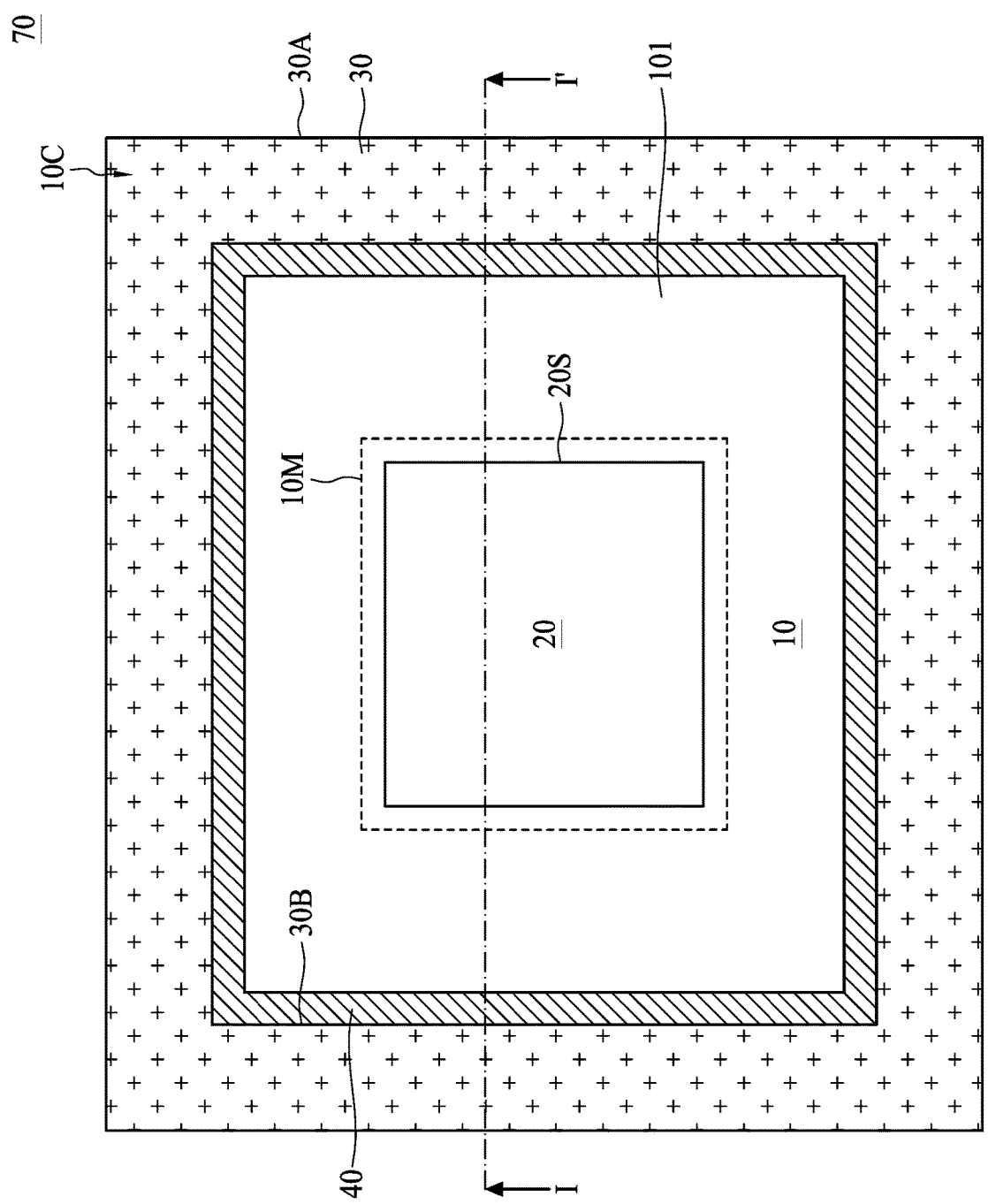
FIG. 12 is a schematic top view of a semiconductor device according to one or more embodiments of the present disclosure.
Figure 12A:
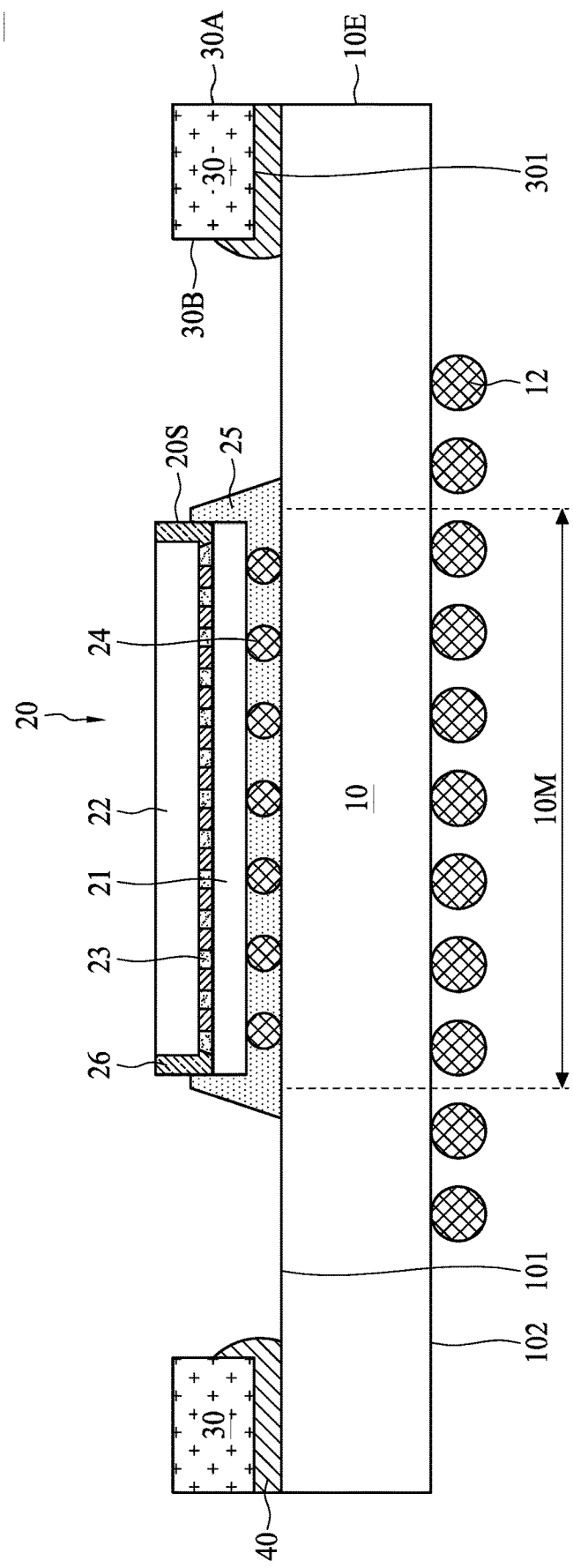
FIG. 12A is a schematic cross-sectional view of a semiconductor device taken along a line I-I' of FIG. 12.

FIG. 12 is a schematic top view of a semiconductor device according to one or more embodiments of the present disclosure, and FIG. 12A is a schematic cross-sectional view of a semiconductor device taken along a line I-I'. As depicted in FIG. 12 and FIG. 12A, the adhesive layer 40 of the semiconductor device 70 is interposed between the first surface 101 of the substrate 10 and the bottom surface 301 of the ring structure 30. In some embodiments, the adhesive layer 40 is extended to be disposed on at least a portion of the inner edge 30B of the ring structure 30 to increase adhesion of the adhesive layer 40 to the inner edge 30B of the ring structure 30.

Figure 13:
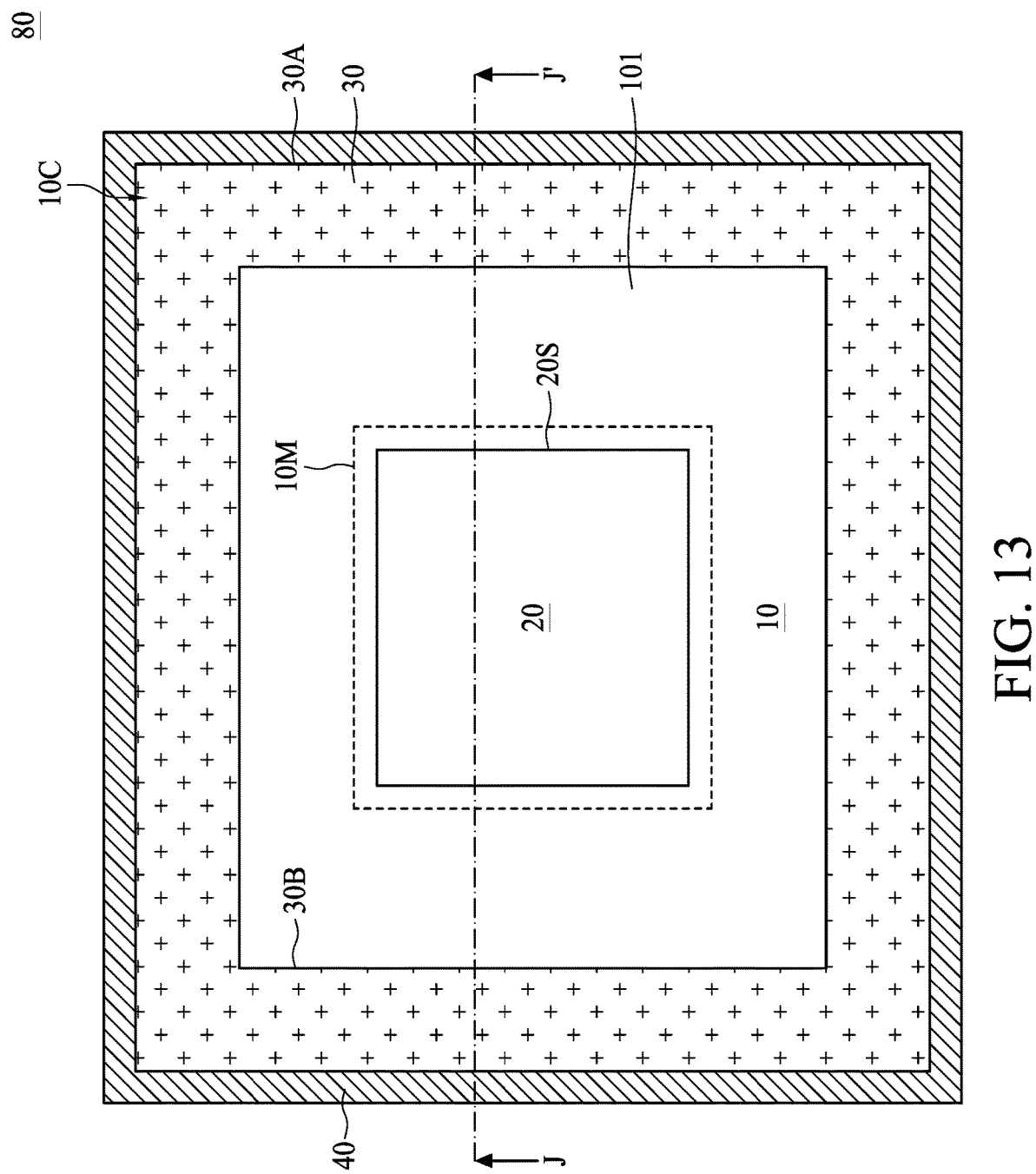
FIG. 13 is a schematic top view of a semiconductor device according to one or more embodiments of the present disclosure.
Figure 13A:
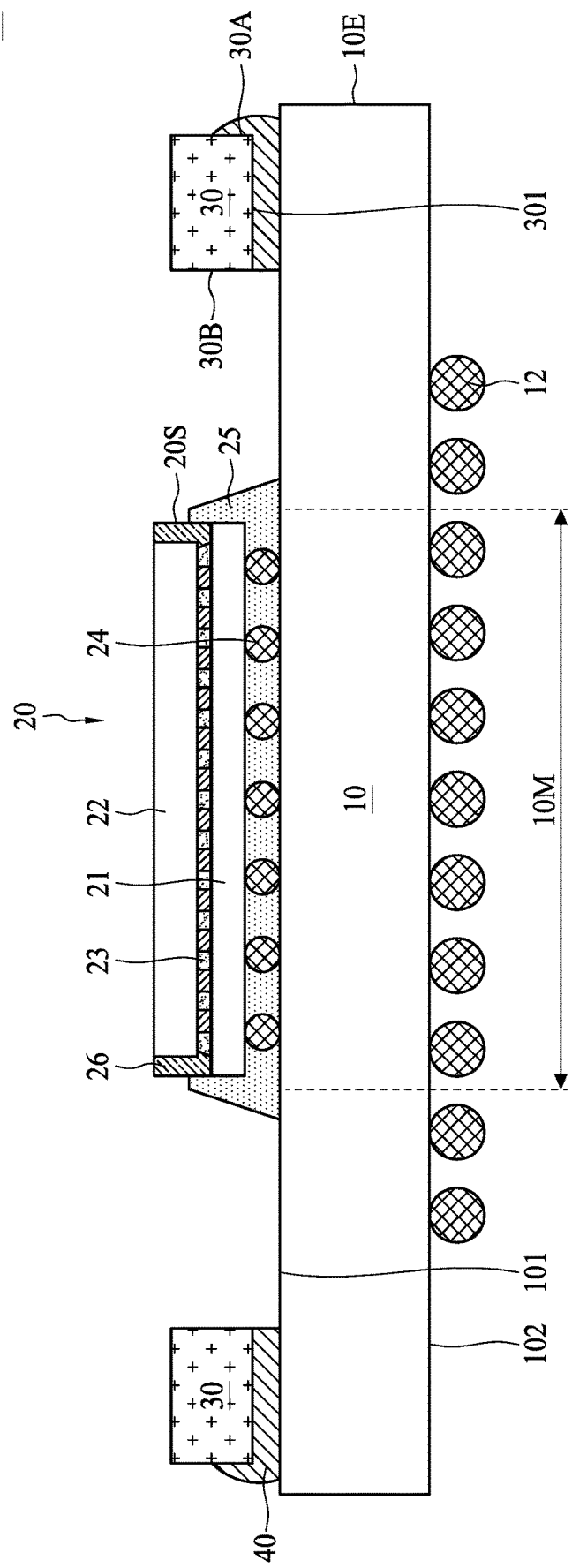
FIG. 13A is a schematic cross-sectional view of a semiconductor device taken along a line J-J' of FIG. 13.

FIG. 13 is a schematic top view of a semiconductor device according to one or more embodiments of the present disclosure, and FIG. 13A is a schematic cross-sectional view of a semiconductor device taken along a line J-J'. As depicted in FIG. 13 and FIG. 13A, the adhesive layer 40 of the semiconductor device 80 is interposed between the first surface 101 of the substrate 10 and the bottom surface 301 of the ring structure 30. In some embodiments, the outer edge 30A of the ring structure 30 may be recessed from an edge 10E, of the substrate 10. In some embodiments, the adhesive layer 40 may be extended to be disposed on at least a portion of the inner edge 30B of the ring structure 30 to increase adhesion of the adhesive layer 40 to the inner edge 30B of the ring structure 30. Consequently, the reliability of the ring structure 30 can be further enhanced.

Figure 14:
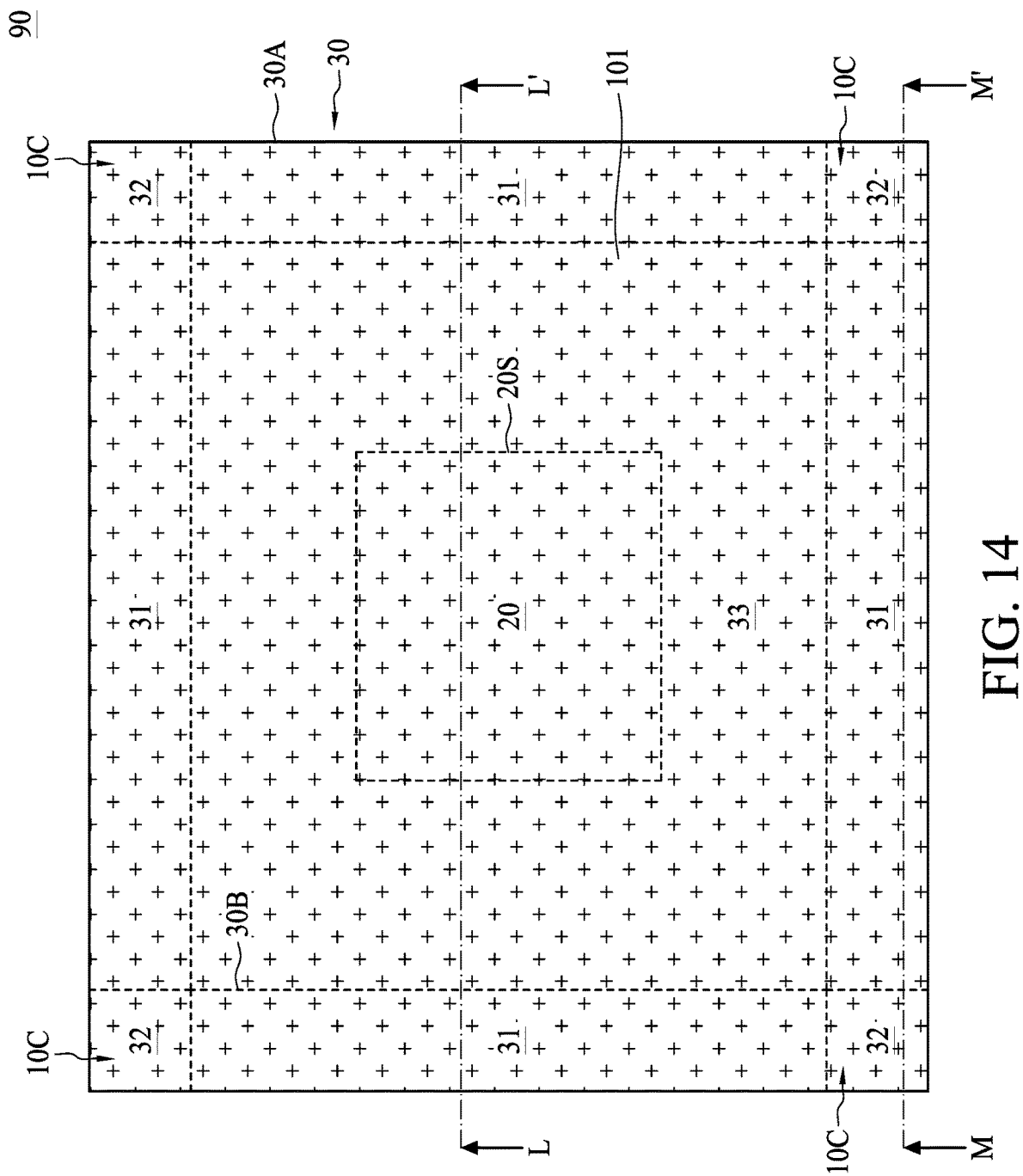
FIG. 14 is a schematic top view of a semiconductor device according to one or more embodiments of the present disclosure.
Figure 14A:
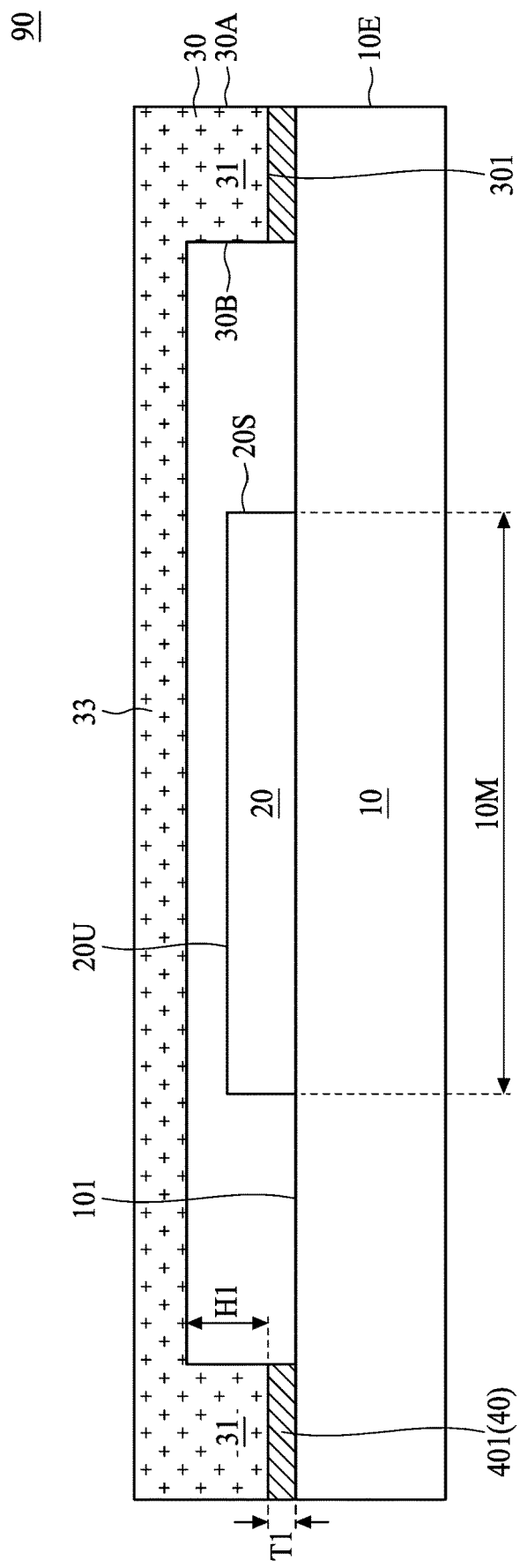
FIG. 14A is a schematic cross-sectional view f a semiconductor device taken along a line L-L' of FIG. 14.
Figure 14B:
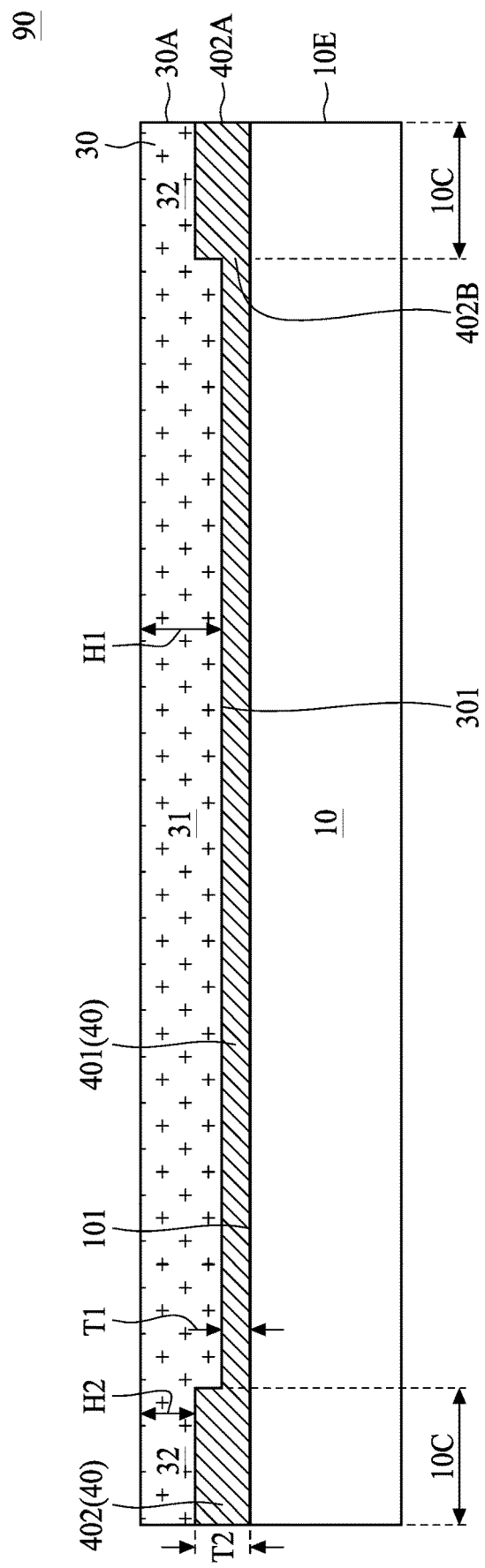
FIG. 14B is a schematic cross-sectional view of a semiconductor device taken along a line M-M' of FIG. 14.

FIG. 14 is a schematic top view of a semiconductor device according to one or more embodiments of the present disclosure, FIG. 14A is a schematic cross-sectional view of a semiconductor device taken along a line L-L', and FIG. 14B is a schematic cross-sectional view of a semiconductor device taken along a line M-M'. As depicted in FIG. 14, FIG. 14A and FIG. 14B, in contrast to the semiconductor device 1 of FIGS. 2, 2A, and 2B, the ring structure 30 of the semiconductor device 90 may further include a lid part 33 connected to the first part 31 and the second part 32. In some embodiments, the lid part 33 is disposed over the electronic component 20, and the lid part 33, the first part 31 and the second part 32 may be configured as a lid structure sealing the electronic component 20 on the substrate 10. In some embodiments, the lid part 33, the first part 31 and the second part 32 may be configured as a shielding element. In some embodiments, the lid part 33 may be spaced apart from or in contact with an upper surface 20U of the electronic component 20. In some embodiments, the lid part 33, the first part 31 and the second part 32 of the ring structure 30 may be formed from the same material, and formed monolithically. The lid part 33 may be applied to the ring structures of any of the semiconductor devices as disclosed in the aforementioned embodiments of FIGS. 2-13.

In some embodiments of the present disclosure, the thicker portion of adhesive layer protrudes toward the recessed part of the ring structure. The softer and flexible adhesive layer protruding toward the recessed part of the ring structure may be configured as a stress buffer that provides cushioning effect between the substrate and the ring structure. In some embodiments, the protruded portion of the adhesive layer enlarges the contact area between the ring structure and the adhesive layer, and thus increases adhesion. In some embodiments, the adhesive layer is further extended to an inner edge and/or an outer edge of the ring structure to increase the contact area between the ring structure and the adhesive layer, and thus adhesion is enhanced. In some embodiments, the protruded portion of the adhesive layer is configured to buffer stress, alleviate delamination of the ring structure, reduce risk of substrate crack, and/or enhance reliability and durability. In some embodiments, the ring structure may be further configured as a lid structure or a shielding element enclosing an electronic component.

In one exemplary aspect, a semiconductor device includes a substrate, an electronic component, a ring structure and an adhesive layer. The substrate has a first surface. The electronic component is over the first surface of the substrate. The ring structure is over the first surface of the substrate, wherein the ring structure includes a first part having a first height, and a second part recessed from the bottom surface and having a second height lower than the first height. The adhesive layer is interposed between the first part of the ring structure and the substrate, and between the second part of the ring structure and the substrate.

In another aspect, a semiconductor device includes a substrate, an electronic component, a ring structure and an adhesive layer. The substrate has a first surface. The electronic component is over the first surface of the substrate. The ring structure is over the first surface of the substrate, and adjacent to edges of the electronic component. The ring structure includes a bottom surface facing the first surface of the substrate. The adhesive layer is interposed between the first surface of the substrate and the bottom surface of the ring structure. The adhesive layer includes a first portion having a first thickness, and a second portion having a second thickness, and the second thickness is larger than the first thickness.

In yet another aspect, a semiconductor device includes a substrate, an electronic component, a ring structure and an adhesive layer. The substrate has a first surface. The electronic component is over the first surface of the substrate. The ring structure is over the first surface of the substrate, wherein the ring structure includes a bottom surface facing the first surface of the substrate. The adhesive layer is interposed between the first surface of the substrate and the bottom surface of the ring structure. The adhesive layer is further extended to be disposed on an inner edge of the ring structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a surface;
   a ring structure over the surface of the substrate, wherein the ring structure includes a bottom surface facing the surface of the substrate, the ring structure includes a plurality of first parts having a first height, and a plurality of second parts recessed from the bottom surface and having a second height lower than the first height, each first part of the ring structure is only disposed correspondingly to each side of the substrate, and each second part of the ring structure is only disposed correspondingly to each corner of the substrate; and
   an adhesive layer interposed between the ring structure and the substrate, wherein the adhesive layer comprises a plurality of first portions having a first thickness and a plurality of second portions having a second thickness greater than the first thickness, each first portion of the adhesive layer is only disposed correspondingly to each side of the substrate, and each second portion of the adhesive layer is only disposed correspondingly to each corner of the substrate, wherein the second parts are disposed at two ends of the first part, the first part has a first outer edge and a first inner edge parallel with each other, the second part has a second outer edge and a second inner edge parallel with each other, a first width of the first part is defined between the first outer edge and the first inner edge, a second width of the second part is defined between the second outer edge and the second inner edge, and the second width is substantially equal to the first width.

2. The semiconductor device of claim 1, wherein the substrate includes a rectangular area and the corners of the substrate consist of four corners of the rectangular area, and the second parts of the ring structure are only corresponding to the four corners of the rectangular area, respectively.

3. The semiconductor device of claim 1, wherein the first portions of the adhesive layer are respectively aligned with the first parts of the ring structure, and the second portions of the adhesive layer are respectively aligned with the second parts of the ring structure.

4. The semiconductor device of claim 1, wherein the second portions of the adhesive layer are exposed from inner edges of the ring structure.

5. The semiconductor device of claim 4, wherein the adhesive layer is further extended to be disposed on at least a portion of the inner edge of the ring structure.

6. The semiconductor device of claim 1, wherein the second portions of the adhesive layer are exposed from outer edges of the ring structure.

7. The semiconductor device of claim 6, wherein the adhesive layer is further extended to be disposed on at least a portion of the outer edge of the ring structure.

8. The semiconductor device of claim 1, wherein an outer edge of the ring structure is substantially aligned with an edge of the substrate.

9. The semiconductor device of claim 1, wherein the ring structure further includes a lid part connected to the first part and the second part.

10. The semiconductor device of claim 1, further comprising an electronic component over the surface of the substrate.

11. The semiconductor device of claim 10, wherein the electronic component comprises a semiconductor die.

12. The semiconductor device of claim 11, wherein the electronic component further comprises an interposer disposed between the substrate and the semiconductor die.

13. The semiconductor device of claim 12, wherein the electronic component further comprises:
a plurality of interconnects disposed between and electrically connected to the interposer and the semiconductor die;
a plurality of connectors disposed between and electrically connected to the interposer and the substrate; and
an underfill disposed between the interposer and the substrate and enclosing the connectors.

14. The semiconductor device of claim 13, wherein the interposer comprises a plurality of through vias.

15. A semiconductor device, comprising:
a substrate having a surface, a plurality of corners and a plurality of sides coupling to the corners;
a ring structure over the surface of the substrate, wherein the ring structure includes a bottom surface facing the surface of the substrate, wherein the ring structure includes a plurality of side parts and a plurality of corner parts recessed from the bottom surface and thinner than the side parts, the corner parts of the ring structure are physically distinct from each other by the side parts, each side part of the ring structure is only disposed correspondingly to each side of the substrate, and each corner part of the ring structure is only disposed correspondingly to each corner of the substrate; and
an adhesive layer interposed between the surface of the substrate and the bottom surface of the ring structure, wherein the adhesive layer comprises a plurality of side portions having a first thickness and a plurality of corner portions having a second thickness greater than the first thickness, each side portion of the adhesive layer is only disposed correspondingly to each side of the substrate, and each corner portion of the adhesive layer is only disposed correspondingly to each corner of the substrate, wherein the side parts and the corner parts are alternately arranged, the side part has an outer side edge and an inner side edge parallel with each other, the corner part has an outer corner edge and an inner corner edge parallel with each other, a width of the side part is defined between the outer side edge and the inner side edge, a width of the corner part is defined between the outer corner edge and the inner corner edge, and the width of the corner part is substantially equal to the width of the side part.

16. The semiconductor device of claim 15, wherein an outer edge of the ring structure is substantially aligned with an edge of the substrate.

17. The semiconductor device of claim 15, wherein an outer edge of the ring structure is recessed from an edge of the substrate, and the adhesive layer is further extended to be disposed on the outer edge of the ring structure.

18. A semiconductor device, comprising:
a substrate having a plurality of corners and a plurality of sides coupling to the corners;
a closed ring structure over the substrate, wherein the ring structure includes a plurality of side parts and a plurality of corner parts thinner than the side parts, and the corner parts and the side parts are alternately arranged and coupled to each other to form the closed ring structure; and
an adhesive layer interposed between the substrate and the ring structure, wherein the adhesive layer comprises a plurality of side portions having a first thickness and a plurality of corner portions having a second thickness greater than the first thickness, each side portion of the adhesive layer is only disposed correspondingly to each side of the substrate, and each corner portion of the adhesive layer is only disposed correspondingly to each corner of the substrate, wherein each edge of each corner part of the closed ring structure is parallel with an edge of the substrate from a top view, each side part of the ring structure is only disposed correspondingly to each side of the substrate, and each corner part of the ring structure is only disposed correspondingly to each corner of the substrate.

19. The semiconductor device of claim 18, wherein the side portions of the adhesive layer are respectively aligned with the side parts of the ring structure, and the corner portions of the adhesive layer are respectively aligned with the corner parts of the ring structure.

20. The semiconductor device of claim 18, wherein an outer edge of the ring structure is substantially aligned with an edge of the substrate.

* * * * *